United States Patent [19]
Aritome

[11] Patent Number: 6,061,280
[45] Date of Patent: May 9, 2000

[54] DATA PROTECTION SYSTEM FOR NONVOLATILE SEMICONDUCTOR MEMORY DEVICE

[75] Inventor: Seiichi Aritome, Yokohama, Japan

[73] Assignee: Kabushiki Kaisha Toshiba, Kawasaki, Japan

[21] Appl. No.: 08/997,304

[22] Filed: Dec. 23, 1997

[30] Foreign Application Priority Data

Dec. 26, 1996 [JP] Japan .................................. 8-349036

[51] Int. Cl.[7] ...................................................... G11C 7/00
[52] U.S. Cl. ...................... 365/195; 365/185.17; 365/184
[58] Field of Search ......................... 365/185.17, 185.33, 365/230.08, 185.22, 191, 185.24, 185.26, 195, 184

[56] References Cited

U.S. PATENT DOCUMENTS

| | | | |
|---|---|---|---|
| 5,031,011 | 7/1991 | Aritome et al. ......................... | 357/23.5 |
| 5,293,337 | 3/1994 | Aritome et al. ......................... | 365/185 |
| 5,321,699 | 6/1994 | Endoh et al. ............................ | 371/21.5 |
| 5,523,980 | 6/1996 | Sakui et al. .......................... | 365/230.08 |
| 5,541,879 | 7/1996 | Suh et al. ............................. | 365/185.22 |
| 5,546,341 | 8/1996 | Suh et al. ............................. | 365/185.33 |
| 5,555,204 | 9/1996 | Endoh et al. .......................... | 365/189.01 |
| 5,568,421 | 10/1996 | Aritome et al. .................... | 365/185.17 |
| 5,680,347 | 10/1997 | Takeuchi et al. .................. | 365/185.17 |
| 5,698,879 | 12/1997 | Aritome et al. ......................... | 257/315 |

*Primary Examiner*—David Nelms
*Assistant Examiner*—Thong Le
*Attorney, Agent, or Firm*—Banner & Witcoff, Ltd.

[57] ABSTRACT

An EEPROM chip includes a unit cell array. A plurality of word lines and bit lines are formed on the unit cell array. Unit cells are arranged at the intersections of these lines. Each unit cell is formed of a NAND-type cell including a plurality of memory transistors connected in series between the bit line and the word line. A selection transistor is connected in series between the drain terminal of the NAND-type cell and the bit line. Another selection transistor is connected in series between the source terminal of the NAND-type cell and the word line. In a normal read operation, a voltage of 5 V (power supply voltage Vcc) is applied to a selection gate to turn on the selection transistor. A read reference voltage of 0 V is applied to a control gate of a selected memory transistors. An ON voltage of 5 V is applied to non-selected control gates to turn on the unit cells having the non-selected control gates. In a read-inhibiting operation, a voltage for forcibly turning off the memory transistor is applied to at least one of the non-selected control gates. The voltage for forcibly turning off the memory transistor is, e.g., −5 V. When such a voltage is applied to the control gate, the current path of the NAND-type cell is cut off. Therefore, no data can be read out from the memory transistor.

31 Claims, 37 Drawing Sheets

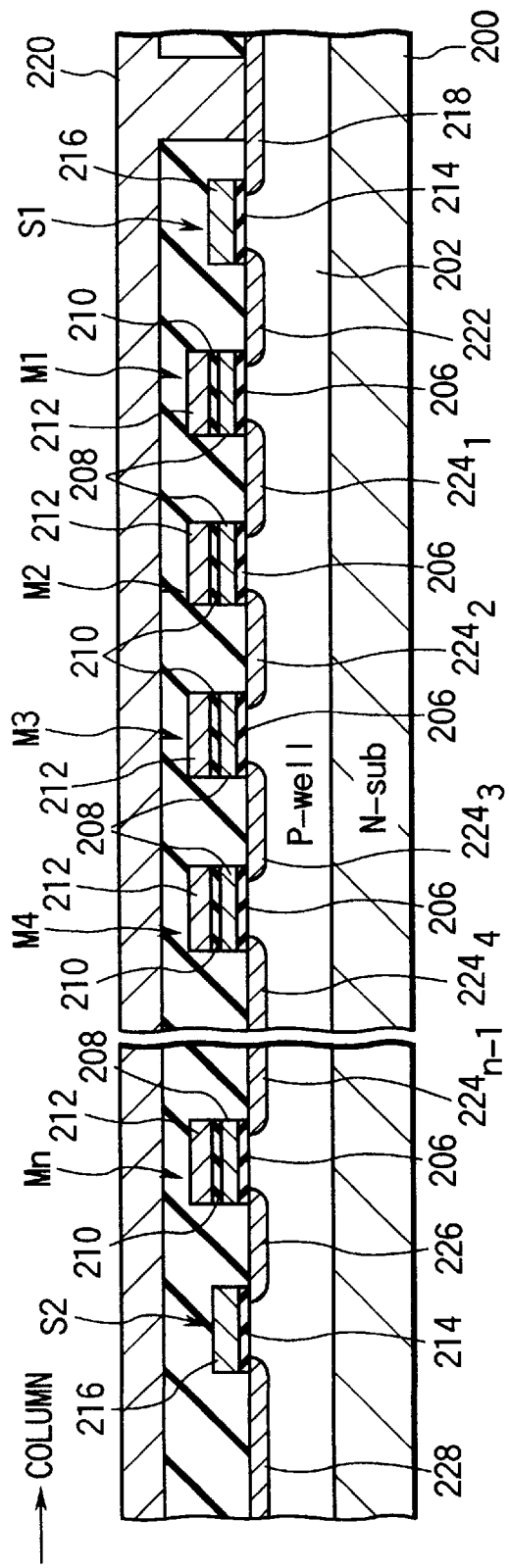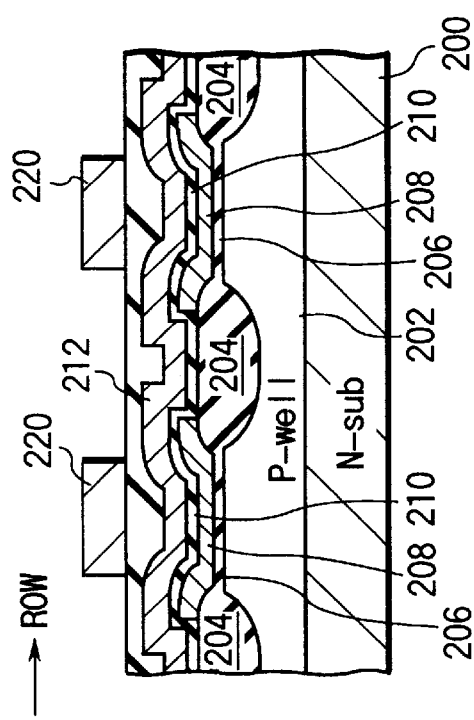
FIG. 4A
FIG. 4B

|  | SIMULTANEOUS ERASE | SELECTIVE WRITE | READ | READ-INHIBITING |
|---|---|---|---|---|
| BL1 | FLOATING | 0V | 5V | 5V |
| BL2 | FLOATING | Vm | 5V | 5V |
| SG1 | Vpp | Vm | 5V | 5V |
| SG2 | Vpp | 0V | 5V | 5V |
| CG1 | 0V | Vm | 5V | −5V |
| CG2 | 0V | Vpp | 0V | 0V |
| CG3 | 0V | Vm | 5V | 5V |
| CG4 | 0V | Vm | 5V | 5V |
| SL | FLOATING | 0V | 0V | 0V |
| P-well | Vpp | 0V | 0V | 0V |
| N-sub | Vpp | 0V | 0V | 0V |

FIG. 5

|  | SIMULTANEOUS ERASE | SELECTIVE WRITE | READ | READ-INHIBITING |
|---|---|---|---|---|
| BL1 | FLOATING | 0V | 5V | 5V |
| BL2 | FLOATING | Vm | 5V | 5V |
| SG1 | Vpp | Vm | 5V | 0V |
| SG2 | Vpp | 0V | 5V | 0V |
| CG1 | 0V | Vm | 5V | 5V |
| CG2 | 0V | Vpp | 0V | 0V |
| CG3 | 0V | Vm | 5V | 5V |
| CG4 | 0V | Vm | 5V | 5V |
| SL | FLOATING | 0V | 0V | 0V |
| P-well | Vpp | 0V | 0V | 0V |
| N-sub | Vpp | 0V | 0V | 0V |

FIG. 6

|  | SIMULTANEOUS ERASE | SELECTIVE WRITE | READ | READ-INHIBITING |
|---|---|---|---|---|
| BL1 | FLOATING | 0V | 5V | 5V |
| BL2 | FLOATING | Vm | 5V | 5V |
| SG1 | Vpp | Vm | 5V | 5V |
| SG2 | Vpp | 0V | 5V | 5V |
| CG1 | 0V | Vm | 5V | 5V |
| CG2 | 0V | Vpp | 0V | 0V |
| CG3 | 0V | Vm | 5V | 5V |
| CG4 | 0V | Vm | 5V | 5V |
| READ-INHIBITING GATE CG0 | 0V | Vm | 5V | −5V |
| SL | FLOATING | 0V | 0V | 0V |
| P-well | Vpp | 0V | 0V | 0V |
| N-sub | Vpp | 0V | 0V | 0V |

FIG. 8

| | SIMULTANEOUS ERASE | SELECTIVE WRITE | READ | READ-INHIBITING |
|---|---|---|---|---|
| BL1 | FLOATING | 0V | 5V | 5V |
| BL2 | FLOATING | Vm | 5V | 5V |
| SG1 | Vpp | Vm | 5V | 5V |
| SG2 | Vpp | 0V | 5V | 5V |
| CG1 | 0V | Vm | 5V | 5V |
| CG2 | 0V | Vpp | 0V | 0V |
| CG3 | 0V | Vm | 5V | 5V |
| CG4 | 0V | Vm | 5V | 5V |
| READ-INHIBITING GATE CG0 | 0V | Vm | 5V | 0V |
| SL | FLOATING | 0V | 0V | 0V |
| P-well | Vpp | 0V | 0V | 0V |
| N-sub | Vpp | 0V | 0V | 0V |

FIG. 9

| | SIMULTANEOUS ERASE | SELECTIVE WRITE | READ | READ-INHIBITING |
|---|---|---|---|---|
| BL1 | FLOATING | 0V | 5V | 5V |
| BL2 | FLOATING | Vm | 5V | 5V |
| SG1 | Vpp | Vm | 5V | 5V |
| SG2 | Vpp | 0V | 5V | 5V |
| CG1 | 0V | Vm | 5V | 5V |
| CG2 | 0V | Vpp | 0V | 0V |
| CG3 | 0V | Vm | 5V | 5V |
| CG4 | 0V | Vm | 5V | 5V |
| READ-INHIBITING GATE CG0 | 0V | Vm | 5V | 0V |
| SL | FLOATING | 0V | 0V | 0V |
| P-well | Vpp | 0V | 0V | 0V |
| N-sub | Vpp | 0V | 0V | 0V |

FIG. 11

|  | SIMULTANEOUS ERASE | SELECTIVE WRITE | READ | READ-INHIBITING |
|---|---|---|---|---|
| BL1 | FLOATING | 8V | 1V | 1V |
| BL2 | FLOATING | 0V | 0V | 0V |
| CG1 | 0V | 0V | 0V | 0V |
| CG2 | 0V | 12V | 5V | 5V |
| CG3 | 0V | 0V | 0V | 0V |
| CG4 | 0V | 0V | 0V | 0V |
| READ-INHIBITING GATE CG0 | 0V, 12V OR FLOATING | 0V | 0V | 10V |
| SL | 12V | 0V | 0V | 0V |
| P-well | 0V | 0V | 0V | 0V |

FIG. 23

|  | SIMULTANEOUS ERASE | SELECTIVE WRITE | READ | READ-INHIBITING |
|---|---|---|---|---|
| BL1 | FLOATING | 8V | 1V | 1V |
| BL2 | FLOATING | 0V | 0V | 0V |
| CG1 | 0V | 0V | 0V | 0V |
| CG2 | 0V | 12V | 5V | 5V |
| CG3 | 0V | 0V | 0V | 0V |
| CG4 | 0V | 0V | 0V | 0V |
| READ-INHIBITING GATE CG0 | 0V, 12V OR FLOATING | 0V | 0V | 5V |
| SL | 12V | 0V | 0V | 0V |
| P-well | 0V | 0V | 0V | 0V |

FIG. 24

|  | SIMULTANEOUS ERASE | SELECTIVE WRITE | READ | READ-INHIBITING |
|---|---|---|---|---|
| BL1 | FLOATING | 8V | 1V | 1V |
| BL2 | FLOATING | 0V | 0V | 0V |
| CG1 | 0V | 0V | 0V | 0V |
| CG2 | 0V | 12V | 5V | 5V |
| CG3 | 0V | 0V | 0V | 0V |
| CG4 | 0V | 0V | 0V | 0V |
| READ-INHIBITING GATE CG0 | 0V, 12V OR FLOATING | 0V | 0V | 5V |
| SL | 12V | 0V | 0V | 0V |
| P-well | 0V | 0V | 0V | 0V |

FIG. 26

|  | SIMULTANEOUS ERASE | SELECTIVE WRITE | READ | READ-INHIBITING |
|---|---|---|---|---|
| BL1 | 0V | 5V OR 0V | 3V | 3V |
| BL2 | 0V | 5V OR 0V | 0V | 0V |
| SG1 | 3V OR 15V | 0V | 3V | 3V |
| SG2 | 3V OR 15V | 0V | 3V | 3V |
| CG1 | 15V | 0V | 0V | 6V |
| CG2 | 15V | -10V | 3V | 3V |
| CG3 | 15V | 0V | 0V | 0V |
| CG4 | 15V | 0V | 0V | 0V |
| SL | 0V | 0V | 0V | 0V |
| P-well | 0V | 0V | 0V | 0V |

FIG. 29

|  | SIMULTANEOUS ERASE | SELECTIVE WRITE | READ | READ-INHIBITING |
|---|---|---|---|---|
| BL1 | 0V | 5V OR 0V | 3V | 3V |
| BL2 | 0V | 5V OR 0V | 0V | 0V |
| SG1 | 3V OR 15V | 0V | 3V | 0V |
| SG2 | 3V OR 15V | 0V | 3V | 0V |
| CG1 | 15V | 0V | 0V | 0V |
| CG2 | 15V | -10V | 3V | 3V |
| CG3 | 15V | 0V | 0V | 0V |
| CG4 | 15V | 0V | 0V | 0V |
| SL | 0V | 0V | 0V | 0V |
| P-well | 0V | 0V | 0V | 0V |

| | SIMULTANEOUS ERASE | SELECTIVE WRITE | READ | READ-INHIBITING |
|---|---|---|---|---|
| BL1 | 0V | 5V OR 0V | 3V | 3V |
| BL2 | 0V | 5V OR 0V | 0V | 0V |
| SG1 | 3V OR 15V | 0V | 3V | 3V |
| SG2 | 3V OR 15V | 0V | 3V | 3V |
| CG1 | 15V | 0V | 0V | 0V |
| CG2 | 15V | -10V | 3V | 3V |
| CG3 | 15V | 0V | 0V | 0V |
| CG4 | 15V | 0V | 0V | 0V |
| READ-INHIBITING GATE CG0 | 15V | 0V | 0V | 6V |
| SL | 0V | 0V | 0V | 0V |
| P-well | 0V | 0V | 0V | 0V |

FIG. 33

| | SIMULTANEOUS ERASE | SELECTIVE WRITE | READ | READ-INHIBITING |
|---|---|---|---|---|
| BL1 | 0V | 5V OR 0V | 3V | 3V |
| BL2 | 0V | 5V OR 0V | 0V | 0V |
| SG1 | 3V OR 15V | 0V | 3V | 3V |
| SG2 | 3V OR 15V | 0V | 3V | 3V |
| CG1 | 15V | 0V | 0V | 0V |
| CG2 | 15V | -10V | 3V | 3V |
| CG3 | 15V | 0V | 0V | 0V |
| CG4 | 15V | 0V | 0V | 0V |
| READ-INHIBITING GATE CG0 | 15V | 0V | 0V | 3V |
| SL | 0V | 0V | 0V | 0V |
| P-well | 0V | 0V | 0V | 0V |

| | SIMULTANEOUS ERASE | SELECTIVE WRITE | READ | READ-INHIBITING |
|---|---|---|---|---|
| BL1 | 0V | 5V OR 0V | 3V | 3V |
| BL2 | 0V | 5V OR 0V | 0V | 0V |
| SG1 | 3V OR 15V | 0V | 3V | 3V |
| SG2 | 3V OR 15V | 0V | 3V | 3V |
| CG1 | 15V | 0V | 0V | 0V |
| CG2 | 15V | −10V | 3V | 3V |
| CG3 | 15V | 0V | 0V | 0V |
| CG4 | 15V | 0V | 0V | 0V |
| READ-INHIBITING GATE CG0 | 15V | 0V | 0V | 3V |
| SL | 0V | 0V | 0V | 0V |
| P-well | 0V | 0V | 0V | 0V |

FIG. 35

DATA PROTECTION SYSTEM FOR NONVOLATILE SEMICONDUCTOR MEMORY DEVICE

BACKGROUND OF THE INVENTION

The present invention relates to a semiconductor integrated circuit having a nonvolatile semiconductor memory device and, more particularly, to a system for protecting stored data.

This application is based on Japanese Patent Application No. 8-349036, filed Dec. 26, 1996, the content of which is incorporated herein by reference.

In the field of nonvolatile semiconductor memory devices, an electrically programmable nonvolatile semiconductor memory device using an FETMOS memory cell having a floating gate is known as an EEPROM. The memory cell array of an EEPROM of this type is formed by arranging memory cells at intersections of row lines (word lines) and row lines (bit lines), which cross each other. In a general EEPROM, two memory cells share a drain to which a row line is connected.

In a NAND-type EEPROM, the number of contacts between drains and row lines is reduced to increase the integration density of the memory cell. The NAND-type EEPROM includes unit cells (to be referred to as NAND cells hereinafter) each comprising a plurality of memory transistors which are connected in series. The memory cell array of the NAND-type EEPROM is constituted by arranging NAND cells at intersections of row lines (including selection gate lines and control gate lines) and row lines. A plurality of NAND cells, e.g., two NAND cells share a drain to which a row line is connected.

In the NAND cell, after electrons are simultaneously discharged from the floating gates of memory elements to erase data (simultaneous erase), electrons are injected into only floating gates of selected memory elements in accordance with data to be written, thereby selectively writing the data.

In the simultaneous erase mode, the voltages of the control gates of all memory elements are set at "L", and the voltage of the well is set at "H", so electrons in the floating gates of the memory elements are extracted to the well.

In the selective write mode, data is sequentially written in the memory elements from the source side to the drain side. In this case, the voltages of the drains of memory elements selected to write data are set at "L" or an intermediate level between "L" and "H" in accordance with the data to be written, and the voltages of control gates are set at "H". If the drain voltages are at "L", electrons are injected into the floating gates.

In non-selected memory elements on the drain side of the selected memory element, the voltage of the control gate is set at almost the same level as that of the intermediate voltage applied to the drain. This is because, in a MOSFET, of the voltage applied to the drain, only a voltage obtained by subtracting the threshold voltage of the MOSFET from the voltage applied to the gate is transmitted to the source.

In a read mode, a power supply voltage Vcc (=4.5 to 5.5 V) is applied to the control gate of each non-selected memory element to turn on the non-selected memory element independently of whether electrons are injected into the floating gate. A voltage of 0 V is applied to memory elements selected to read out data. Each memory element selected to read out data is turned on or off depending on whether electrons are injected into the floating gate. With this operation, data stored in the memory element is read out.

In such a conventional NAND-type EEPROM, confidential data stored in the EEPROM cannot be read out unless a specific signal is input. Anyone can access the confidential data stored in the EEPROM so that there arises a problem in security. The security is very important if the EEPROM is used as a memory card. That is, an operation of protecting stored data (read-inhibiting operation) cannot be performed. This applies not only to the NAND-type EEPROM but also to a general NOR-type EEPROM, a NAND-type EEPROM having NOR cells, and a DINOR-type EEPROM.

The conventional nonvolatile semiconductor memory device cannot perform an operation of enabling a data read only when a predetermined condition for reading out data is satisfied, and otherwise, inhibiting the data read.

BRIEF SUMMARY OF THE INVENTION

Accordingly, it is an object of the present invention to provide a data protection system for a nonvolatile semiconductor memory device, which requires a predetermined condition in addition to normal read voltage setting for read access and inhibits read access unless this predetermined condition is satisfied, thereby protecting stored data.

According to a first aspect of the present invention, there is provided a semiconductor memory device comprising a first signal line and a second signal line, which are formed on a substrate; memory elements connected in series between the first signal line and the second signal line, each memory element having a variable threshold voltage; and a read-inhibiting circuit for applying a voltage for turning off at least one given memory element in reading data from the memory elements, thereby inhibiting data read.

According to the first aspect, when the given memory element is turned off, no data can be read out from the memory element. Thus, data stored in the memory element is protected.

According to a second aspect of the present invention, in the first aspect, the read-inhibiting circuit applies a voltage lower than a lowest threshold voltage of the memory elements to a gate of the given memory element.

According to the second aspect, even when data is stored in the given memory element, the given memory element can be reliably turned off.

According to a third aspect of the present invention, in the first aspect, the read-inhibiting circuit applies a read reference voltage to a gate of the given memory element when a threshold voltage of the given memory element is higher than the read reference voltage.

According to the third aspect, a read can be inhibited without using any special voltage.

According to a fourth aspect of the present invention, the read reference voltage of the third aspect is 0 V.

According to the fourth aspect, a specific value of the read reference voltage is determined.

According to a fifth aspect of the present invention, in one of the first to fourth aspects, data for determining whether the data read is to be inhibited is stored in the given memory element.

According to the fifth aspect, the degree of freedom for setting of the read-inhibiting operation increases, and for example, the read-inhibiting state can be set in units of addresses.

According to a sixth aspect of the present invention, there is provided a semiconductor memory device comprising a first signal line and a second signal line, which are formed on a substrate; memory elements connected in parallel between the first signal line and the second signal line and having a variable threshold voltage; and a read-inhibiting circuit for applying a voltage for turning on at least one given memory element in reading data from the memory elements, thereby inhibiting data read.

According to the sixth aspect, when at least one given memory element is turned on, no normal data can be read out from the memory elements. Therefore, data stored in the memory elements is protected.

According to a seventh aspect of the present invention, in the sixth aspect, the read-inhibiting circuit applies the voltage higher than a highest threshold voltage of the memory elements to a gate of the given memory element.

According to the seventh aspect, even when data is stored in the given memory element, the given memory element can be reliably turned on.

According to an eighth aspect of the present invention, in the sixth aspect, the read-inhibiting circuit applies a read reference voltage to a gate of the given memory element when a threshold voltage of the given memory element is lower than the read reference voltage.

According to the eighth aspect, a read can be inhibited without using any special voltage.

According to a ninth aspect of the present invention, the read reference voltage of the eighth aspect is the power supply voltage.

According to the ninth aspect, a specific value of the read reference voltage is determined.

According to a tenth aspect of the present invention, in one of the sixth to ninth aspects, data for determining whether the data read is to be inhibited is stored in the given memory element.

According to the tenth aspect, the degree of freedom for setting of the read-inhibiting operation increases, and for example, the read-inhibiting state can be set in units of addresses.

According to an eleventh aspect of the present invention, there is provided a semiconductor memory device comprising a first signal line and a second signal line, which are formed on a substrate; unit cells connected in parallel between the first signal line and the second signal line, each unit cell being formed of at least one memory element having a variable threshold voltage; a selection element serially connected to at least one of a path between the unit cell and the first signal line and a path between the unit cell and a second signal line; and a read-inhibiting circuit for applying a voltage for turning off the selection element of a selected unit cell in reading data from the selected unit cell, thereby inhibiting data read.

According to the eleventh aspect, when the selection element selected to read out data is turned off, no normal data can be read out from the unit cell selected to read out data. Therefore, data stored in the unit cell is protected.

According to a twelfth aspect of the present invention, in the eleventh aspect, the read-inhibiting circuit applies a voltage lower than a threshold voltage of the selection element to a gate of the selection element.

According to the twelfth aspect, the selection element can be reliably turned off.

According to a thirteenth aspect of the present invention, in the eleventh aspect, the read-inhibiting circuit applies a voltage of 0 V to a gate of the selection element when a threshold voltage of the given memory element is higher than 0 V.

According to the thirteenth aspect, the data read-inhibiting operation can be performed without using any special voltage.

According to a fourteenth aspect of the present invention, in one of the eleventh to thirteenth aspects, the unit cell comprises a NAND-type unit cell including memory elements whose current paths are connected in series between the first signal line and the second signal line.

According to the fourteenth aspect, a specific example of the unit cell is provided.

According to a fifteenth aspect of the present invention, in one of the eleventh to thirteenth aspects, the unit cell comprises a NOR-type unit cell including memory elements whose current paths are connected in parallel between the first signal line and the second signal line.

According to the fifteenth aspect, a specific example of the unit cell is provided.

According to a sixteenth aspect of the present invention, there is provided a semiconductor memory device comprising a first signal line and a second signal line, which are formed on a substrate; unit cells connected in parallel between the first signal line and the second signal line, each unit cell being formed of at least one memory element having a variable threshold voltage; a selection element serially connected to the memory element in the unit cell between the first signal line and the second signal line; and a read-inhibiting circuit for applying a voltage for turning off the selection element serially connected to a selected memory element in reading data from the selected memory element, thereby inhibiting data read.

According to the sixteenth aspect of the present invention, when the selection element is turned off, no normal data can be read out from the unit cell. Therefore, data stored in the memory cell is protected.

According to a seventeenth aspect of the present invention, in the sixteenth aspect, the unit cell comprises a NAND-type unit cell including memory elements whose current paths are connected in series between the first signal line and the second signal line.

According to the seventeenth aspect, a specific example of the unit cell is provided.

According to an eighteenth aspect of the present invention, in the sixteenth aspect, data for determining whether the data read is to be inhibited is stored in the selection element.

According to the eighteenth aspect, the selection element can be reliably turned off.

According to a nineteenth aspect of the present invention, there is provided a semiconductor memory device comprising a first signal line and a second signal line, which are formed on a substrate; unit cells connected in parallel between the first signal line and the second signal line, each unit cell being formed of at least one memory element having a variable threshold voltage; a selection element connected in parallel to the unit cell between the first signal line and the second signal line; and a read-inhibiting circuit for applying a voltage for turning on the selection element connected in parallel to a selected unit cell in reading data from the selected unit cell, thereby inhibiting data read.

According to the nineteenth aspect, since data read inhibition is registered for an arbitrary address of the memory cell array, the degree of freedom for data read inhibition increases.

According to a twentieth aspect of the present invention, in the nineteenth aspect, the unit cell comprises a NOR-type unit cell including memory elements whose current paths are connected in parallel between the first signal line and the second signal line.

According to the twentieth aspect, a specific example of the unit cell is provided.

According to a twenty-first aspect of the present invention, in the nineteenth aspect, data for determining whether the data read is to be inhibited is stored in the selection element.

According to the twenty-first aspect, the selection element can be reliably turned off.

According to a twenty-second aspect of the present invention, there is provided a data read-inhibiting method for a semiconductor integrated circuit, comprising the steps of registering data read inhibition for an arbitrary address of a unit cell array; requesting the arbitrary address of the unit cell array to read out data; determining whether read inhibition is registered for the read-requested address; if read inhibition is not registered for the read-requested address, setting a read enable voltage for the read-requested address of the unit cell array; and if read inhibition is registered for the read-requested address, at least setting a read-inhibiting voltage for the read-requested address or outputting data representing read inhibition, thereby inhibiting a read operation.

According to the twenty-second aspect, since data read inhibition is registered for an arbitrary address of the memory cell array, the degree of freedom for data read inhibition increases.

According to a twenty-third aspect of the present invention, there is provided a data read-inhibiting method for a semiconductor integrated circuit, comprising the steps of registering chip data in a semiconductor integrated circuit chip including a unit cell array; inputting comparison data to the semiconductor integrated circuit chip and comparing the input comparison data with the chip data; requesting the unit cell array of the semiconductor integrated circuit chip to read out data; if the comparison data does not match the chip data, setting a read-inhibiting voltage for the unit cell array or outputting data representing read inhibition, thereby setting a read-inhibiting mode; and if the comparison data matches the chip data, resetting the read-inhibiting mode.

According to the twenty-third aspect of the present invention, when the comparison data matches the chip data, data can be read out. Therefore, the confidentiality of the data increases.

According to a twenty-fourth aspect of the present invention, there is provided an integrated circuit type storage medium system comprising: an integrated circuit type storage medium comprising a unit cell array and including a function of setting a read-inhibiting voltage for the unit cell array or outputting data representing read inhibition to set a read-inhibiting mode, and a function of receiving comparison data from an external device, comparing the comparison data with chip data registered in the storage medium, and if the comparison data matches the chip data, resetting the read-inhibiting mode; and a processing unit including a function of transmitting the comparison data to the integrated circuit type storage medium and requesting the storage medium to read out data, and receiving a response from the integrated circuit type storage medium.

According to the twenty-fourth aspect, in the field of the integrated circuit type storage media, data stored in the integrated circuit type storage medium can be read out when the comparison data matches the chip data. Therefore, the confidentiality of the data stored in the integrated circuit type storage medium increases.

Additional objects and advantages of the present invention will be set forth in the description which follows, and in part will be obvious from the description, or may be learned by practice of the present invention.

The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 4A is a sectional view taken along a line IVA—IVA in FIG. 3;

FIG. 4B is a sectional view taken along a line IVB—IVB in FIG. 3;

FIG. 5 shows a signal voltage relationship for explaining the operations of the NAND-type EEPROM according to the first embodiment;

FIG. 6 shows a signal voltage relationship for explaining the operations of a NAND-type EEPROM according to a second embodiment;

FIG. 8 shows a signal voltage relationship for explaining the operations of the NAND-type EEPROM according to the third embodiment;

FIG. 9 shows a signal voltage relationship for explaining the operations of a NAND-type EEPROM according to a fourth embodiment;

FIG. 11 shows a signal voltage relationship for explaining the operations of the NAND-type EEPROM according to the fifth embodiment;

FIG. 23 shows a signal voltage relationship for explaining the operations of the NOR-type EEPROM according to the tenth embodiment;

FIG. 24 shows a signal voltage relationship for explaining the operations of a NOR-type EEPROM according to an eleventh embodiment of the present invention;

FIG. 26 shows a signal voltage relationship for explaining the operations of the NOR-type EEPROM according to the twelfth embodiment;

FIG. 29 shows a signal voltage relationship for explaining the operations of the AND-type EEPROM according to the fourteenth embodiment;

FIG. 30 shows a signal voltage relationship for explaining the operations of an AND-type EEPROM according to a fifteenth embodiment;

FIG. 32 shows a signal voltage relationship for explaining the operations of the AND-type EEPROM according to the sixteenth embodiment;

FIG. 33 shows a signal voltage relationship for explaining the operations of an AND-type EEPROM according to a seventeenth embodiment of the present invention;

FIG. 35 shows a signal voltage relationship for explaining the operations of the AND-type EEPROM according to the eighteenth embodiment;

DETAILED DESCRIPTION OF THE INVENTION

A preferred embodiment of a nonvolatile semiconductor memory device according to the present invention will now be described with reference to the accompanying drawings.

(First Embodiment)

Figure 1:
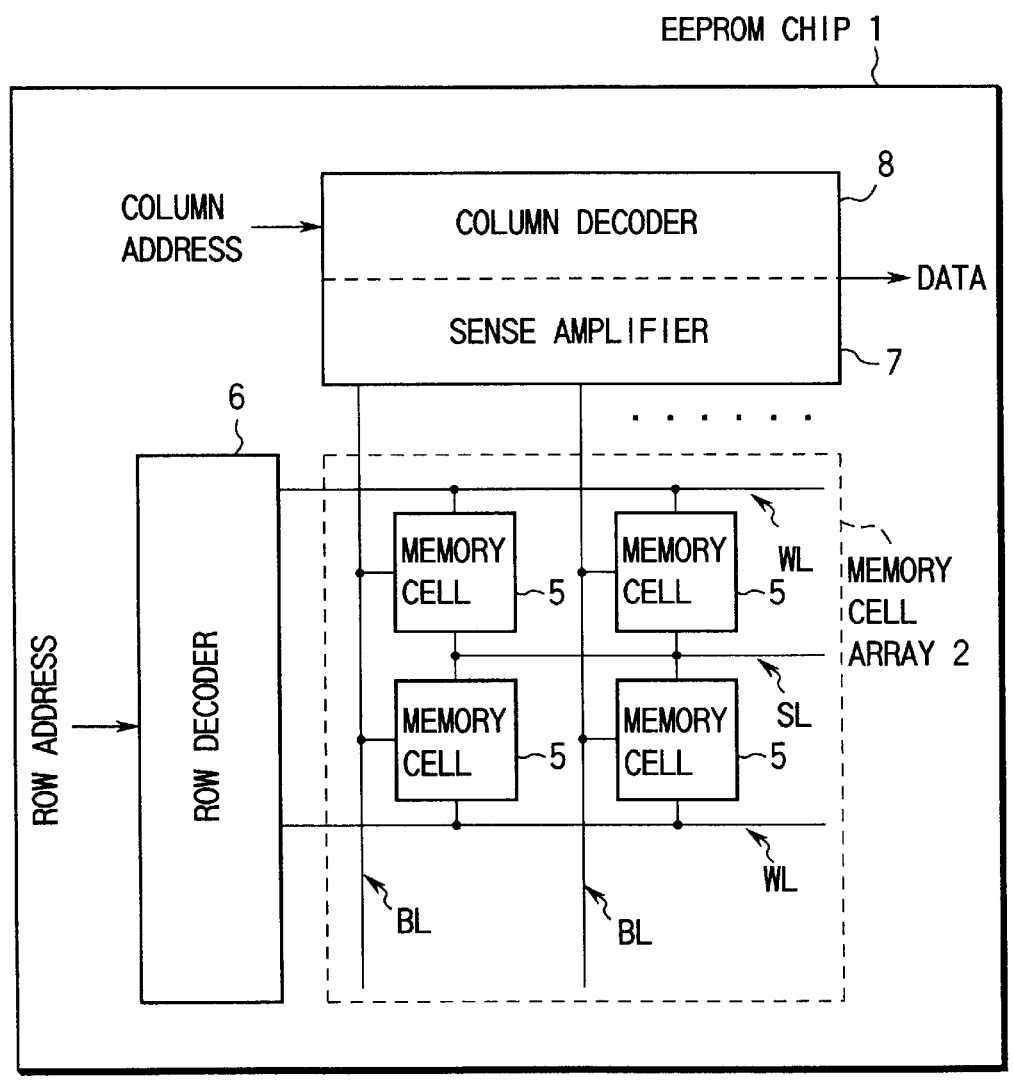
FIG. 1 is a block diagram showing the entire arrangement of an EEPROM according to a first embodiment of the present invention.

FIG. 1 is a block diagram of an EEPROM according to the first embodiment of the present invention. An EEPROM chip 1 includes a memory cell array 2. In the memory cell array 2, a plurality of row lines (word lines) WL and row lines (bit lines) BL are formed, and memory cells 5 are arranged at intersections of the word lines WL and the bit lines BL. Each memory cell 5 is formed of one memory transistor (in a NOR-type) or a plurality of memory transistors (in a NAND-type, AND-type, or DINOR-type). A row decoder 6 decodes a row address signal to select a word line WL to be activated. The memory cells 5 connected to the activated word line WL output data corresponding to stored contents to the bit lines BL. A sense amplifier 7 amplifies/holds the data output to the bit lines BL. A column decoder 8 decodes a column address signal to select bit lines BL. Data amplified/held by the sense amplifier 7 is output from the selected bit lines BL.

In the present invention, when the EEPROM having the above arrangement is accessed, a normal read operation of normally reading out data or a read-inhibiting operation for inhibiting the normal data read operation can be selected depending on whether one condition is satisfied.

These two operations will be described below in detail by exemplifying a NAND-type EEPROM.

Figure 2:
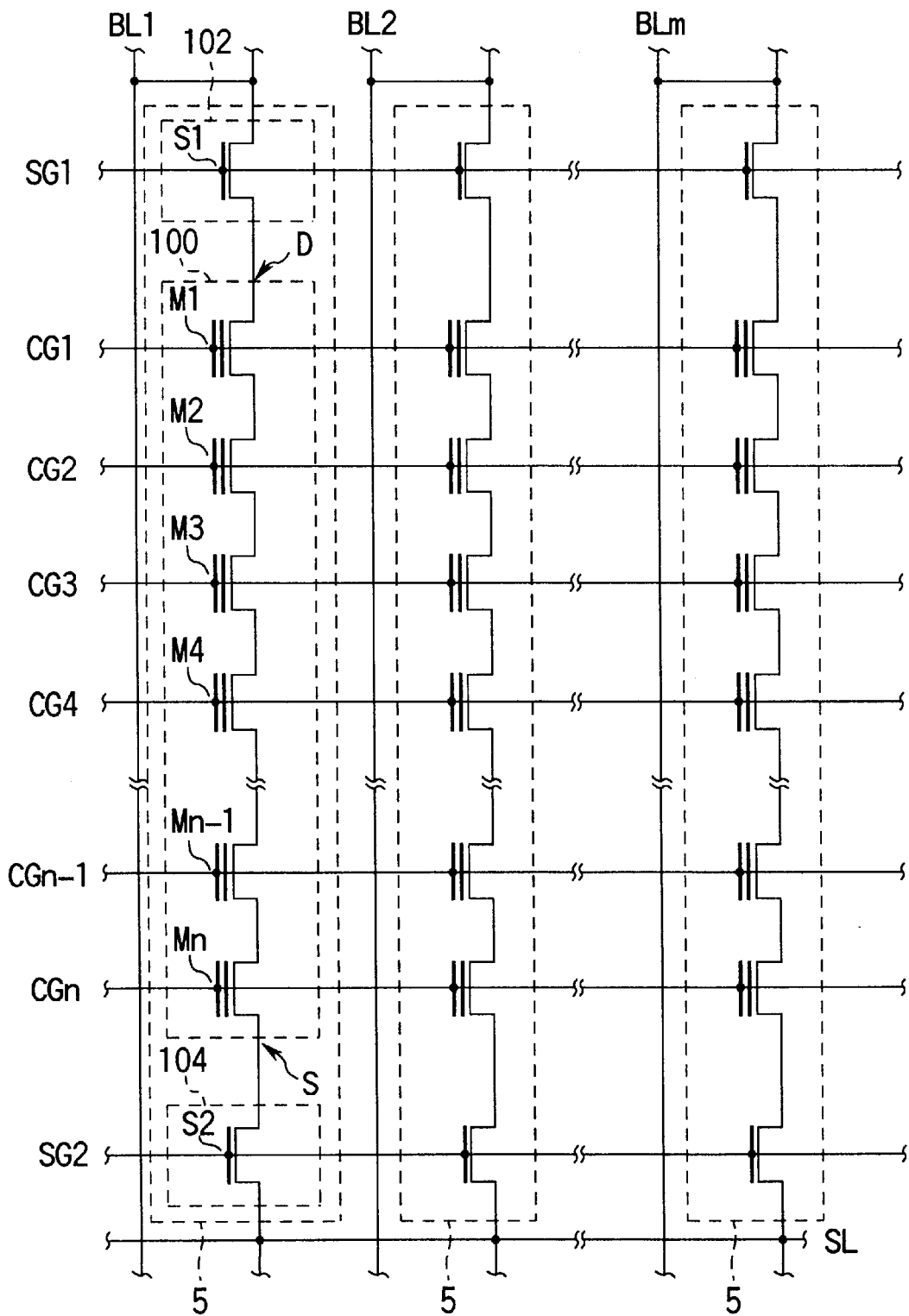
FIG. 2 is an equivalent circuit diagram of a NAND-type EEPROM according to the first embodiment.

FIG. 2 is an equivalent circuit diagram of the memory cell array 2 of the NAND-type EEPROM. The memory cell array 2 of the NAND-type EEPROM is characterized in that each memory cell 5 is formed of a unit cell (to be referred to as a NAND cell hereinafter) including a plurality of memory transistors which are connected in series between the bit line BL and a source line SL. The memory cell 5 includes a NAND cell 100 comprising a plurality of memory transistors M1 to Mn connected in series, a drain-side selection gate 102 formed of a selection transistor S1 connected in series between a drain terminal D of the NAND cell 100 and a bit line BL1, and a source-side selection gate 104 formed of a selection transistor S2 connected in series between a source terminal S of the NAND cell 100 and the source line SL. The source line SL is commonly connected to adjacent NAND cells 100.

In the NAND-type EEPROM, one of the word lines WL shown in FIG. 1 corresponds to a plurality of control gate lines CG1 to CGn. One bit line BL corresponds to one of bit lines BL1 to BLm.

Figure 3:
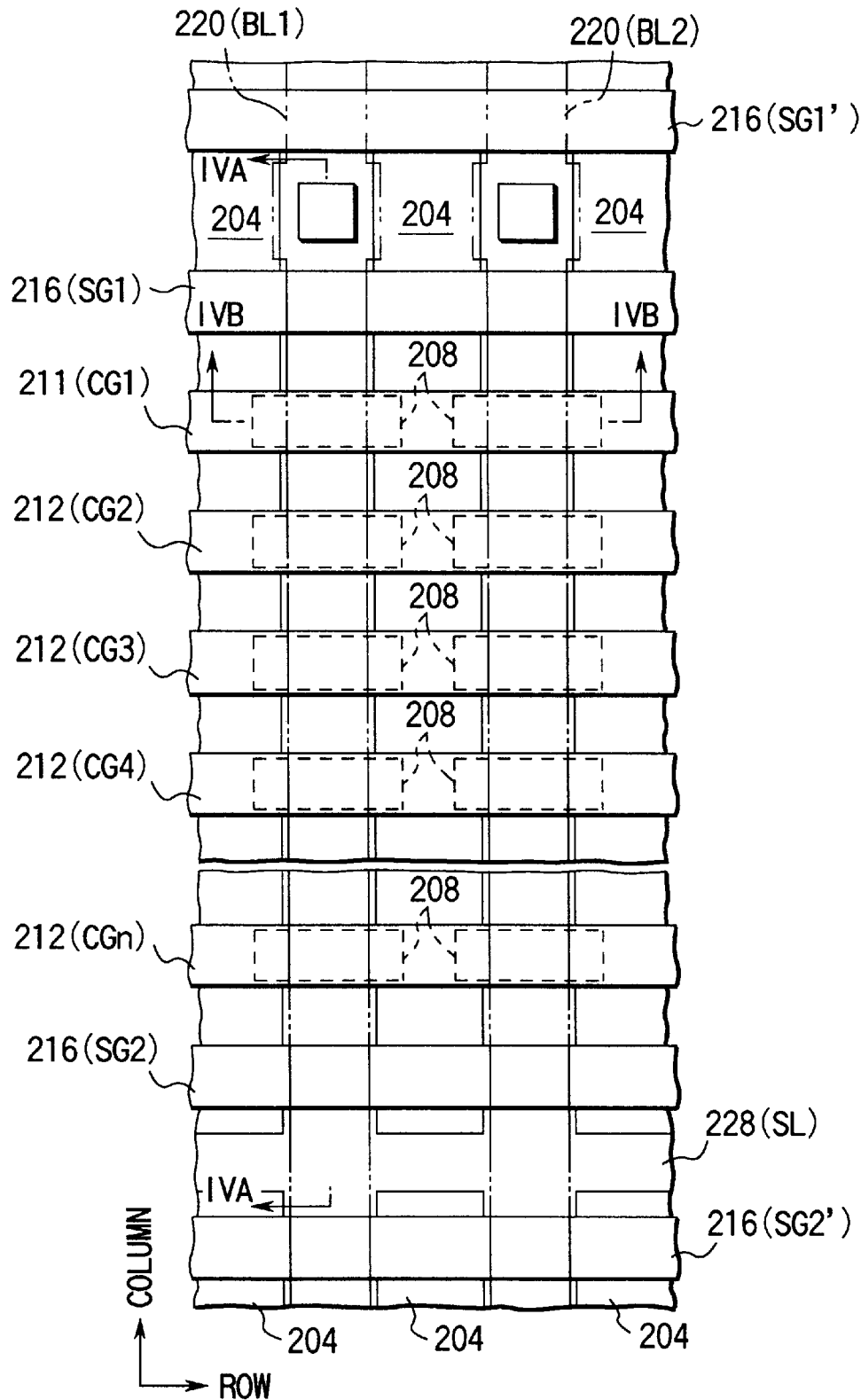
FIG. 3 is a plan view of the NAND-type EEPROM according to the first embodiment.

FIG. 3 is a plan view of the memory cell array 2 of the NAND-type EEPROM.

FIG. 4A is a sectional view taken along a line IVA—IVA in FIG. 3. FIG. 4B is a sectional view taken along a line IVB—IVB in FIG. 3.

As shown in FIGS. 3, 4A, and 4B, a p-type well region (P-well) 202 is formed on an n-type silicon substrate (N-sub) 200 (or an n-type well region). A field oxide film ($SiO_2$) 204 is formed on the surface of the well region 202. The field oxide film 204 divides an element region on the surface of the well region 202. The memory transistors M1 to Mn and the selection transistors S1 and S2 are formed on the well region 202 divided by the field oxide film 204. An example of the memory transistors M1 to Mn is a floating gate type MOS transistor in which a tunnel oxide film ($SiO_2$) 206, a floating gate 208, an insulating film 210 (e.g., three-layered film of $SiO_2/Si_3N_4/SiO_2$) between the floating gate and the control gate, and a control gate 212 (CG) are sequentially formed on the well region 202. One example of the selection transistors S1 and S2 is a normal MOS transistor in which a gate oxide film ($SiO_2$) 214 and a gate (SG) 216 are formed on the well region 202.

An n-type drain region 218 of the selection transistor S1 is formed in the well region 202 and connected to a bit line (BL1) 220. An n-type source region 222 is formed in the well region 202 and also serves as one of the n-type source and drain regions of the memory transistor M1. The other n-type source/drain region 2241 of the memory transistor M1 is also serves as one of the source and drain regions of the memory transistor M2. The other n-type source/drain region 2242 of the memory transistor M2 is also serves as one of the source and drain regions of the memory transistor M3. This pattern is repeated to the memory transistor Mn. An n-type drain region 226 of the selection transistor S2 is also serves as the other source/drain region of the memory transistor Mn. An n-type source region (SL) 228 of the selection transistor S2 is formed in the well region 202 along the row and also serves as the n-type source regions (SL) of other selection transistors.

Operations of the NAND-type EEPROM according to the first embodiment will be described below assuming that, of the four control gates CG1 to CG4 (n=4), the control gate CG2 is selected to read out data from the memory transistor M2 connected to the control gate CG2.

FIG. 5 shows the voltage relationship for the respective operations of the NAND-type EEPROM according to the first embodiment. As shown in FIG. 5, the voltage relationships for the simultaneous erase operation and selective write operation of the first embodiment are the same as those for the conventional operations. Note that a write/erase voltage Vpp is about 20 V, and an intermediate voltage Vm corresponds to about Vpp/2.

Only operations different from the conventional operations will be described below in detail.

Read (Normal Read) Operation:

As shown in FIG. 5, in the normal read operation, a voltage of 5 V (power supply voltage Vcc) is applied to the selection gates SG1 and SG2 to turn on the selection transistors S1 and S2, respectively. A read reference voltage of 0 V is applied to the control gate CG2 selected for read access, and an ON voltage of 5 V is applied to the non-selected control gates CG1, CG3, and CG4, so the memory transistors M1, M3, and M4 are turned on.

The memory transistor M2 is turned on when the threshold voltage is lower than the read reference voltage of 0 V and turned off when it is higher than the read reference voltage of 0 V. With this arrangement, data of level "0" and data of level "1" are discriminated.

Read-inhibiting Operation:

As shown in FIG. 5, in the read-inhibiting operation, a voltage for forcibly turning off memory transistors is applied to at least one (CG1 in this case) of the non-selected control gates CG1, CG3, and CG4 independently of the presence/absence of electrons in the floating gate of the memory transistor. This voltage is selected such that it is lower than a lowest threshold voltage of the memory elements. The voltage for forcibly turning off the memory transistor is, e.g., −5 V. When this voltage of −5 V is applied to, e.g., the control gate CG1, the current path of the NAND cell is cut off during the read-inhibiting operation. Therefore, no normal data can be read out from the memory transistor M2 to be accessed. In this way, read access to normal data in the memory transistor M2 is disabled, thereby realizing the read-inhibiting state.

In the read-inhibiting operation of the first embodiment, the voltage (to be referred to as a read-inhibiting voltage hereinafter) for forcibly turning off the memory transistor is applied to the non-selected control gate CG1, as shown in FIG. 5. This read-inhibiting voltage can be applied to the non-selected control gate CG3 or CG4. The read-inhibiting voltage can be applied to the plurality of non-selected control gates.

In this case, the read-inhibiting voltage is set at −5 V. However, it may be a voltage which can forcibly turn off the memory transistor, i.e., a voltage lower than the lowest one of some threshold voltages of the memory transistor. When the lowest threshold voltage of the memory transistor is −3 V, the read-inhibiting voltage may be −3 V or less.

As described above, according to the first embodiment, a voltage for forcibly turning off the memory transistor is applied to at least one of the non-selected control gates to cut off the current path of the NAND cell, thereby inhibiting read access to the selected memory transistor. In other words, normally, the voltage for forcibly turning off the memory transistor is applied to at least one of the non-selected control gates, and only when an command/operation of canceling the read-inhibiting state is input/performed, application of the read-inhibiting voltage can be disabled to set the normal read operation.

Other embodiments of the EEPROM according to the present invention will be described. The same portions as those of the first embodiment will be indicated in the same reference numerals and their detailed description will be omitted.

(Second Embodiment)

The second embodiment is different from the first embodiment in that not a memory transistor but a selection gate is forcibly turned off in the read-inhibiting operation.

FIG. 6 shows a voltage relationship for the respective operations of a NAND-type EEPROM according to the second embodiment.

Normal Read Operation:

The normal read operation is the same as in the first embodiment shown in FIG. 5.

Read-inhibiting Operation:

As shown in FIG. 6, in the read-inhibiting operation, a voltage for forcibly turning off selection transistors S1 and S2 is applied to selection gates SG1 and SG2. The voltage for forcibly turning off the selection transistors S1 and S2 is, e.g., 0 V. When such a voltage is applied to the selection gates SG1 and SG2, the current path of the NAND cell is cut off during the read-inhibiting operation. Therefore, no normal data can be read out from a memory transistor M2 to be accessed, as in the first embodiment.

In the read-inhibiting operation of the second embodiment, the voltage for forcibly turning off the selection transistors S1 and S2 is applied to the selection gates SG1 and SG2, as shown in FIG. 6. However, a voltage for forcibly turning off one of the selection transistors may be applied to one of the selection gates SG1 and SG2.

(Third Embodiment)

The read-inhibiting state is realized by forcibly turning off some of non-selected control gates in the first embodiment and by forcibly turning off control gates in the second embodiment. In a NAND-type EEPROM according to the third embodiment, a read-inhibiting gate for inhibiting read access is additionally arranged in a memory cell array 2. The current path of the NAND cell is cut off by turning off the read-inhibiting gate.

Figure 7:
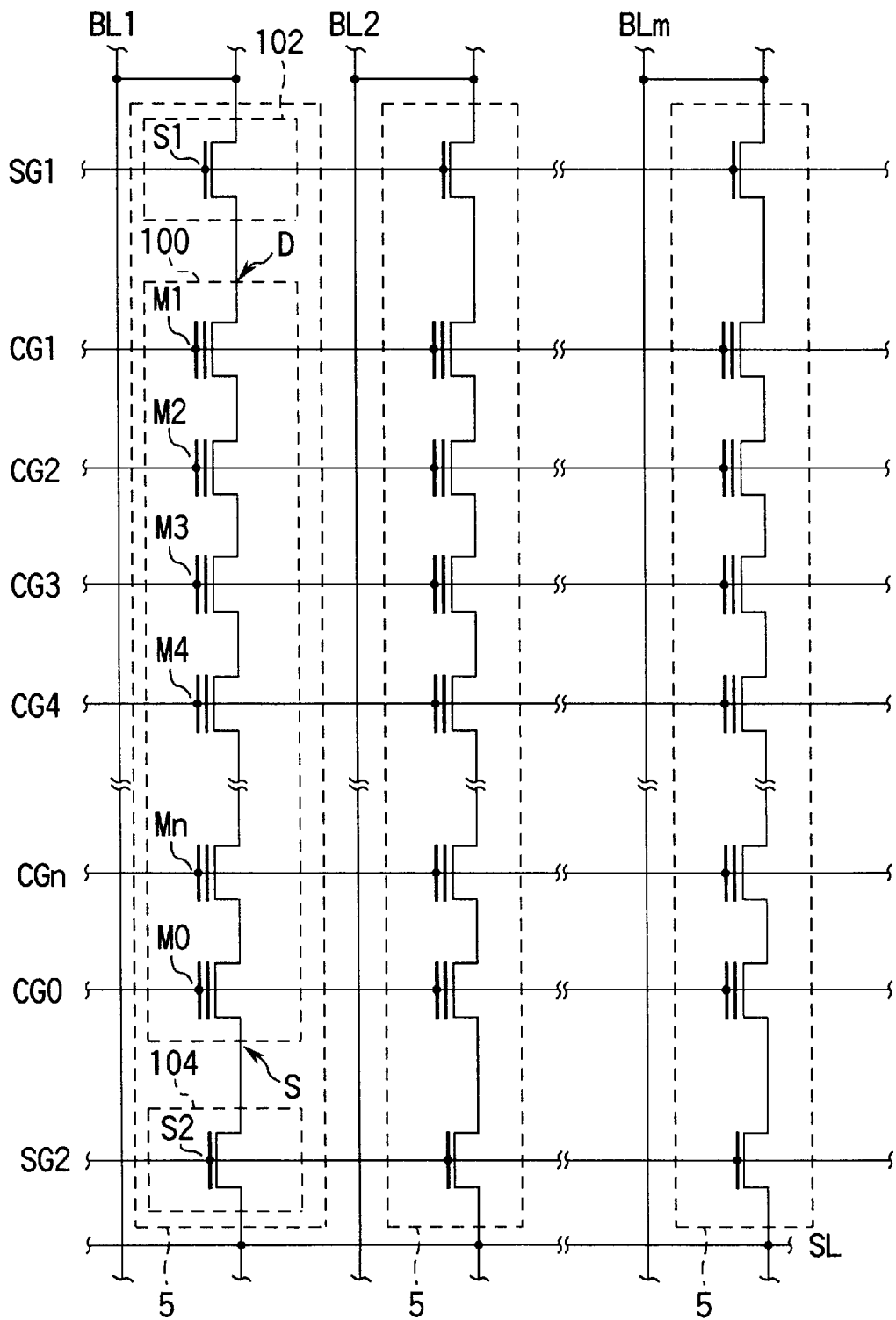
FIG. 7 is an equivalent circuit diagram of a NAND-type EEPROM according to a third embodiment of the present invention.

FIG. 7 is an equivalent circuit diagram of the memory cell array 2 of the NAND-type EEPROM according to the third embodiment.

As shown in FIG. 7, a read-inhibiting gate CG0 is connected in parallel to the control gates CG1 to CGn. In the read-inhibiting operation, a transistor M0 connected to the read-inhibiting gate CG0 cuts off the current path between a source terminal S and a drain terminal D of the NAND cell. In the third embodiment, the transistor M0 serially connected to the read-inhibiting gate CG0 includes the same structure as that of memory transistors M1 to Mn.

Operations of the NAND-type EEPROM of the third embodiment will be described below assuming that, of the four control gates CG1 to CG4 (n=4), the control gate CG2 is selected to read out data from the memory transistor M2 connected to the control gate CG2.

FIG. 8 shows a voltage relationship for the respective operations of the NAND-type EEPROM according to the third embodiment.

Simultaneous Erase Operation:

As shown in FIG. 8, a voltage of 0 V is applied to the read-inhibiting gate CG0.

A voltage relationship for gates other than the read-inhibiting gate CG0 is the same as that in the conventional simultaneous erase operation, as shown in FIG. 8.

Selective Write Operation

As shown in FIG. 8, a voltage Vm (=Vpp/2) is applied to the read-inhibiting gate CG0.

A voltage relationship for gates other than the read-inhibiting gate CG0 is the same as that in the conventional selective write operation, as shown in FIG. 8.

Normal Read Operation:

As shown in FIG. 8, a voltage of 5 V is applied to the read-inhibiting gate CG0 to turn on the memory transistor M0 having the read-inhibiting gate CG0 as its gate. A voltage relationship for gates other than the read-inhibiting gate CG0 is the same as that in the conventional read operation, as shown in FIG. 8, and data can be normally read out.

Read-inhibiting Operation:

As shown in FIG. 8, a voltage of −5 V is applied to the read-inhibiting gate CG0 to forcibly turn off the memory transistor M0 having the read-inhibiting gate CG0 as its gate. With this operation, the current path of the NAND cell is cut off, so data cannot be normally read out even when voltage relationships for gates other than the read-inhibiting gate CG0 are the same as those in the conventional normal read operation, as shown in FIG. 8.

(Fourth Embodiment)

The equivalent circuit diagram of the fourth embodiment is the same as that of the third embodiment. In the fourth embodiment, however, since the voltage of −5 V which is to be applied to a read-inhibiting gate CG0 is difficult to generate, data for identifying the normal read operation or read-inhibiting operation is stored in a memory transistor M0 connected to the read-inhibiting gate CG0 in advance. This data will be described later.

FIG. 9 shows a voltage relationship for the respective operations of a NAND-type EEPROM according to the fourth embodiment.

Simultaneous Erase Operation:

The simultaneous erase operation is the same as in the third embodiment shown in FIG. 8.

Selective Write Operation:

The selective write operation is the same as in the third embodiment shown in FIG. 8.

Normal Read Operation:

As shown in FIG. 9, a voltage of 5 V is applied to the read-inhibiting gate CG0 to turn on the memory transistor M0 having the read-inhibiting gate CG0 as its gate. A voltage relationship for gates other than the read-inhibiting gate CG0 is the same as that in the conventional read operation, as shown in FIG. 9, so data can be normally read out.

Read-inhibiting Operation:

As shown in FIG. 9, a voltage of 0 V is applied to the read-inhibiting gate CG0. This voltage equals the voltage of a control gate CG2 shown in the column of the normal read operation in FIG. 9, i.e., the read reference voltage.

If the threshold voltage of the memory transistor M0 is higher than the read reference voltage of 0 V (if data causing the memory transistor M0 to be turned off upon application of a voltage of 0 V to the read-inhibiting gate CG0 is stored in the transistor M0 in advance), the memory transistor M0 is turned off. In this case, the current path of the NAND cell is cut off (read access is inhibited), so data cannot be normally read out even when a voltage relationship for gates other than the read-inhibiting gate CG0 is the same as that in the normal read operation, as shown in FIG. 9.

If the threshold voltage of the memory transistor M0 is lower than the read reference voltage of 0 V (if data causing the memory transistor M0 to be turned on upon application of a voltage of 0 V to the read-inhibiting gate CG0 is stored in the transistor M0 in advance), the memory transistor M0 is turned on. In this case, when a voltage relationship for gates other than the read-inhibiting gate CG0 is the same as that in the normal read operation, data can be normally read out.

In the fourth embodiment, when an ON voltage of 5 V is applied to the read-inhibiting gate CG0, the memory transistor M0 is turned on independently of data stored in the transistor M0. Therefore, the stored read-inhibiting state can be avoided, as needed.

(Fifth Embodiment)

Figure 10:
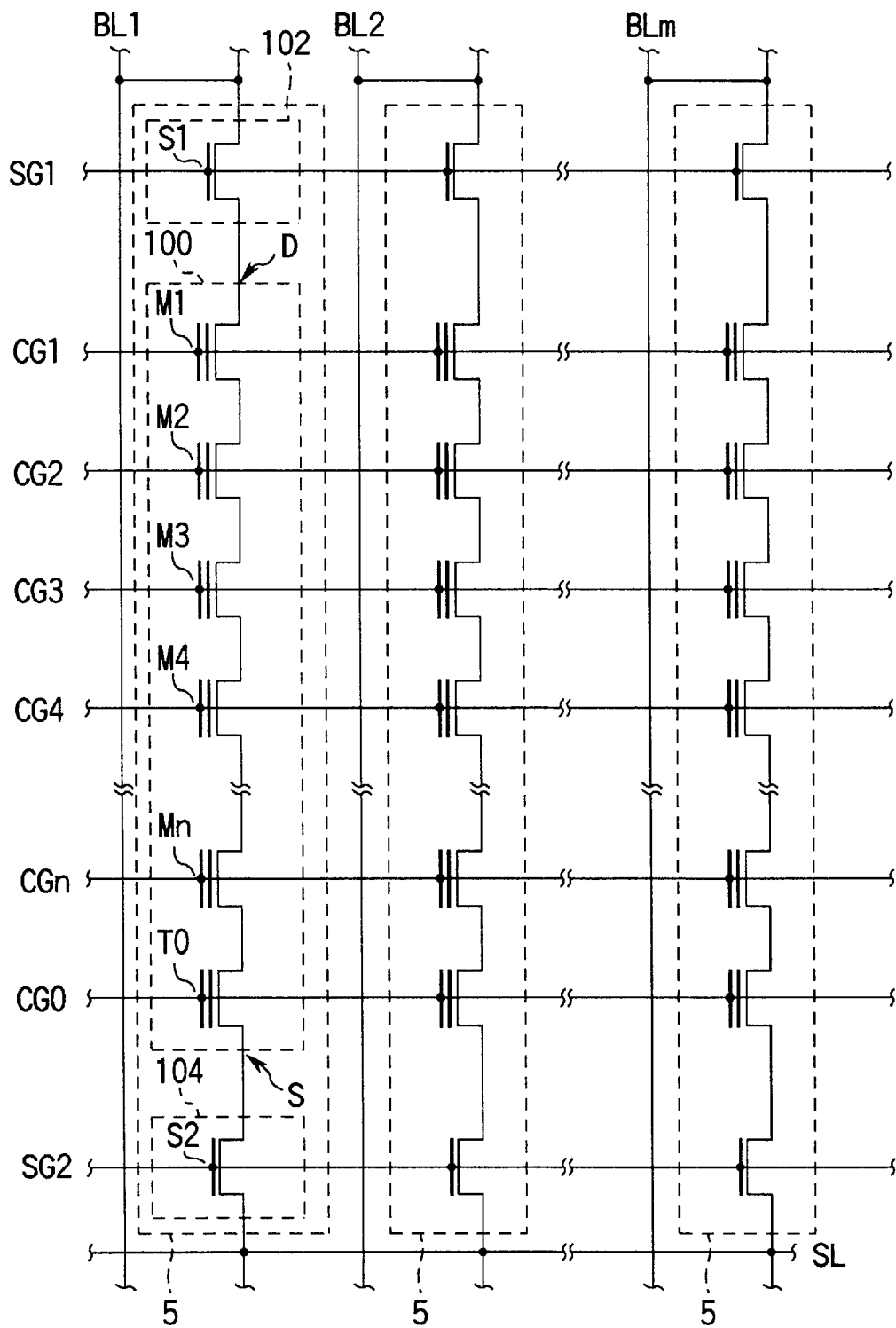
FIG. 10 is an equivalent circuit diagram of a NAND-type EEPROM according to a fifth embodiment of the present invention.

FIG. 10 is an equivalent circuit diagram of a memory cell array 2 of a NAND-type EEPROM according to the fifth embodiment.

As shown in FIG. 10, in the fifth embodiment, not a memory transistor but a transistor T0 having a different structure is connected to a read-inhibiting gate CG0. The transistor T0 includes a normal MOSFET structure or a structure in which the floating gate portion of a memory transistor is short-circuited to a control gate, as shown in FIG. 10.

Operations of the NAND-type EEPROM of the fifth embodiment will be described below assuming that, of four control gates CG1 to CG4 (n=4), the control gate CG2 is selected to read out data from a memory transistor M2 connected to the control gate CG2.

FIG. 11 shows a voltage relationship for the respective operations of the NAND-type EEPROM according to the fifth embodiment.

Simultaneous Erase Operation:

As shown in FIG. 11, a voltage of 0 V is applied to the read-inhibiting gate CG0.

A voltage relationship for gates other than the read-inhibiting gate CG0 is the same as that in the conventional simultaneous erase operation.

Selective Write Operation:

As shown in FIG. 11, a voltage Vm (=Vpp/2) is applied to the read-inhibiting gate CG0.

A voltage relationship for gates other than the read-inhibiting gate CG0 is the same as that in the conventional selective write operation, as shown in FIG. 11.

Normal Read Operation:

As shown in FIG. 11, a voltage of 5 V is applied to the read-inhibiting gate CG0 to turn on the transistor T0 having the read-inhibiting gate CG0 as its gate. A voltage relationship for gates other than the read-inhibiting gate CG0 is the same as that in the conventional read operation, as shown in FIG. 11, and data can be normally read out.

Read-inhibiting Operation:

As shown in FIG. 11, a voltage of 0 V is applied to the read-inhibiting gate CG0 to turn off the transistor T0 having the read-inhibiting gate CG0 as its gate. With this operation, the current path of the NAND cell is cut off, so data cannot be normally read out even when a voltage relationship for gates other than the read-inhibiting gate CG0 is the same as that in the conventional normal read operation, as shown in FIG. 11.

(Sixth Embodiment)

An EEPROM of the sixth embodiment includes an arrangement capable of switching the read-inhibiting operation and normal read operation in the first to fifth embodiments (FIGS. 5, 6, 8, 9, and 11).

Figure 12:
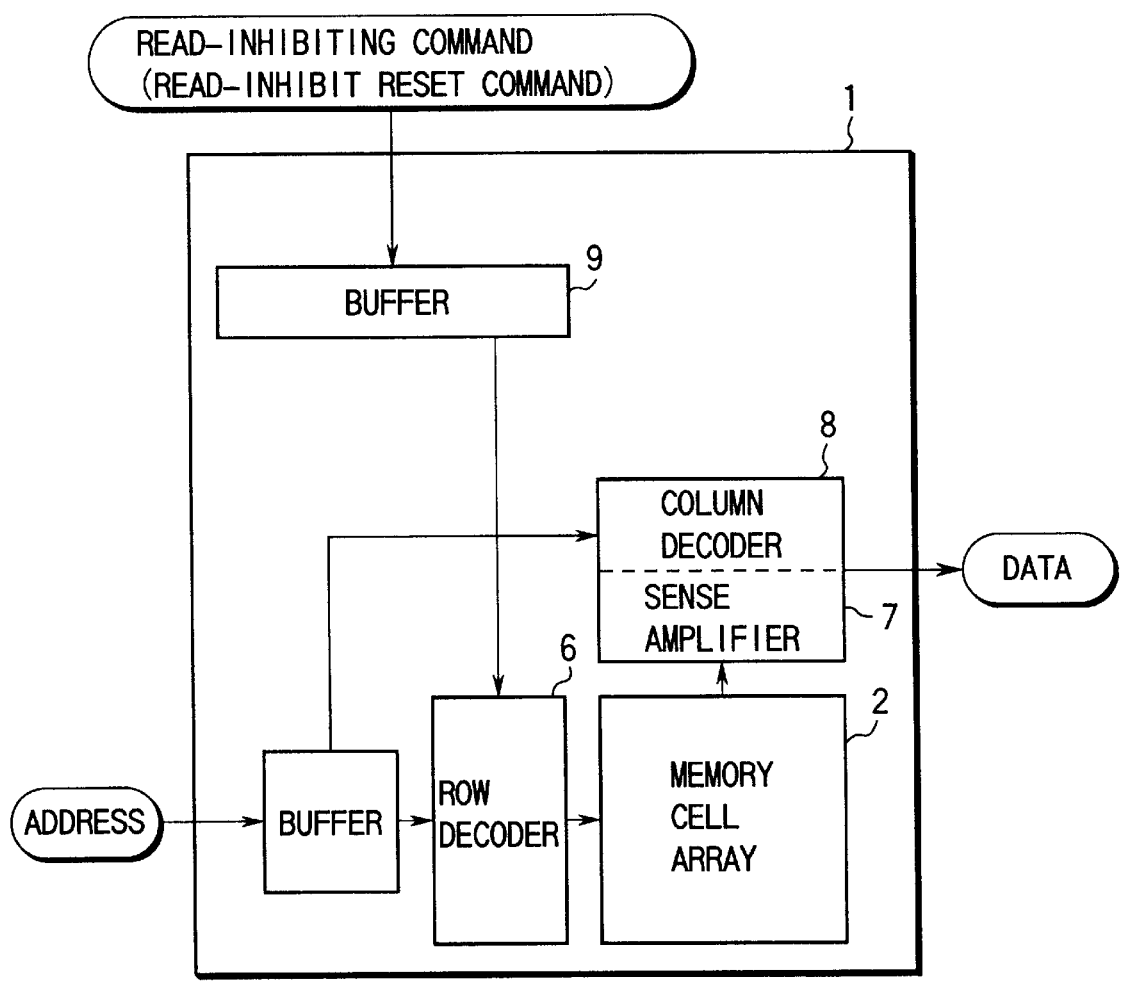
FIG. 12 is a block diagram showing the entire arrangement of an EEPROM according to a sixth embodiment of the present invention.

FIG. 12 is a block diagram of the EEPROM according to the sixth embodiment.

As shown in FIG. 12, an EEPROM chip 1 includes a buffer 9. A read-inhibiting command is input to the buffer 9. The input read-inhibiting command is input to a row decoder 6. When the read-inhibiting command has been received or is being received, the row decoder 6 can generate voltages for the respective row lines as shown in the column of the read-inhibiting operation in FIGS. 5, 6, 8, 9, and 11 to set a read-inhibiting state.

It is possible to input a read-inhibit reset command instead of the read-inhibiting command to the chip 1. In this case, when the read-inhibit reset command has been input or is being input, the row decoder 6 can generate voltages for the respective row lines as shown in the column of the normal read operation in FIGS. 5, 6, 8, 9, and 11 to set a normal read state.

(Seventh Embodiment)

An EEPROM of the seventh embodiment includes another arrangement capable of switching the read-inhibiting operation and normal read operation in the first to fifth embodiments (FIGS. 5, 6, 8, 9, and 11).

Figure 13:
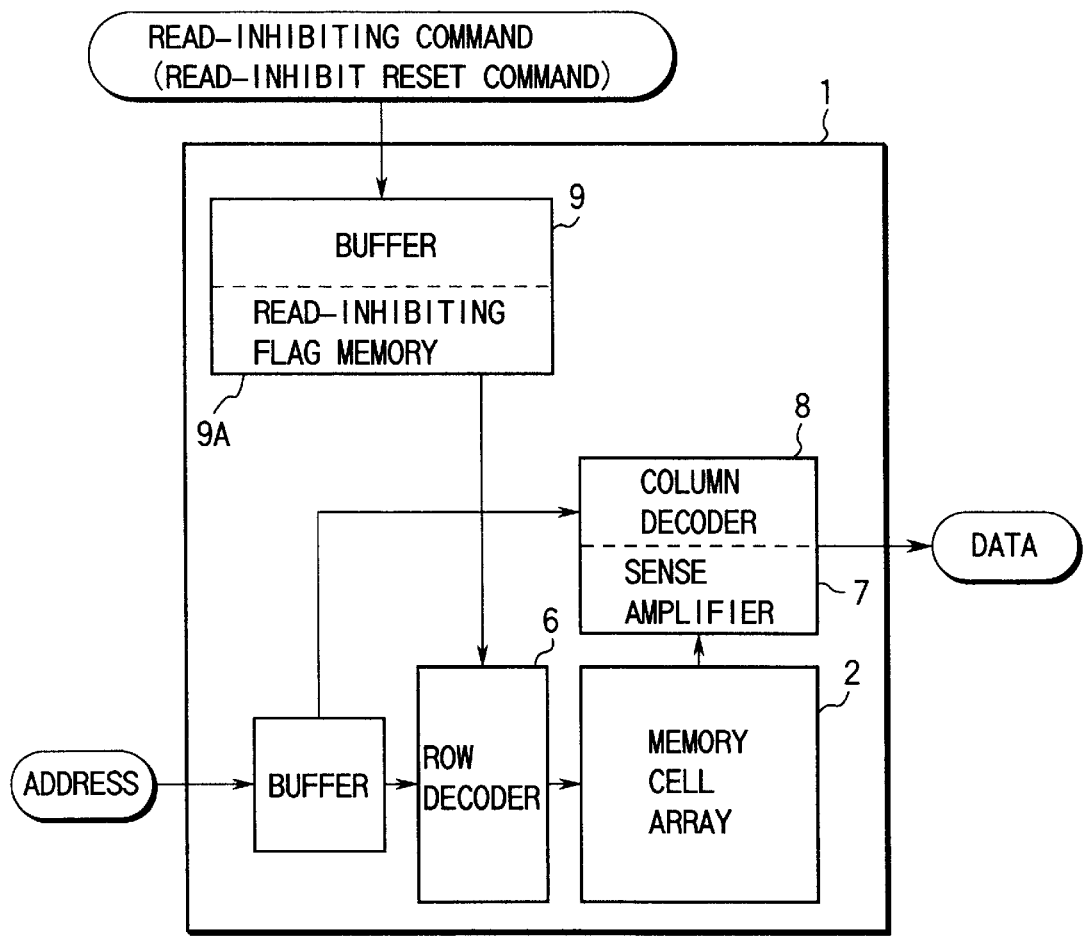
FIG. 13 is a block diagram showing the entire arrangement of an EEPROM according to a seventh embodiment of the present invention.

FIG. 13 is a block diagram of the EEPROM according to the seventh embodiment.

As shown in FIG. 13, a chip 1 includes a memory 9A for storing a read-inhibiting flag. Upon receiving a read-inhibiting command, the memory 9A stores a flag indicating a read-inhibiting state. When the read-inhibiting flag has been received or is being received from the memory 9A, a row decoder 6 can generate voltages for the respective row lines as shown in the column of the read-inhibiting operation in FIGS. 5, 6, 8, 9, and 11 to set the read-inhibiting state. The read-inhibiting flag can be reset by inputting a read-inhibit reset command to the memory 9A.

In this EEPROM, the read-inhibiting state can be set while the flag for inhibiting read access is stored in the memory 9A.

The memory 9A can store not the flag for inhibiting read access but a flag for resetting the read-inhibiting state. In this case, the normal read state can be set while the flag for resetting the read-inhibiting state is stored in the memory 9A.

(Eighth Embodiment)

An EEPROM of the eighth embodiment has still another arrangement capable of switching the read-inhibiting operation and normal read operation in the first to fifth embodiments (FIGS. 5, 6, 8, 9, and 11). In the eighth embodiment, the read-inhibiting state can be set over a memory cell array 2 or in units of addresses.

Figures 14A, 14B:
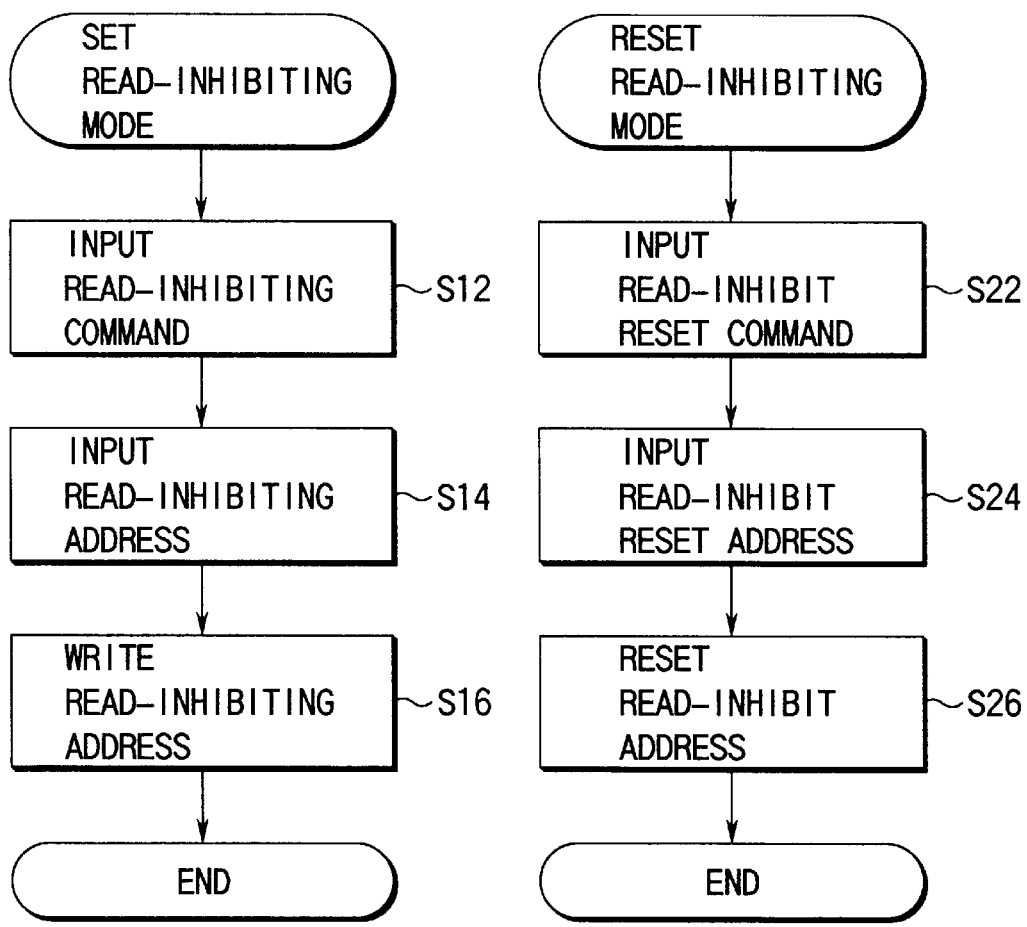
FIG. 14A is a flow chart showing the read-inhibiting address input operation of an EEPROM according to an eighth embodiment of the present invention.
FIG. 14B is a flow chart showing the read-inhibiting address reset operation of the EEPROM according to the eighth embodiment.
Figure 15:
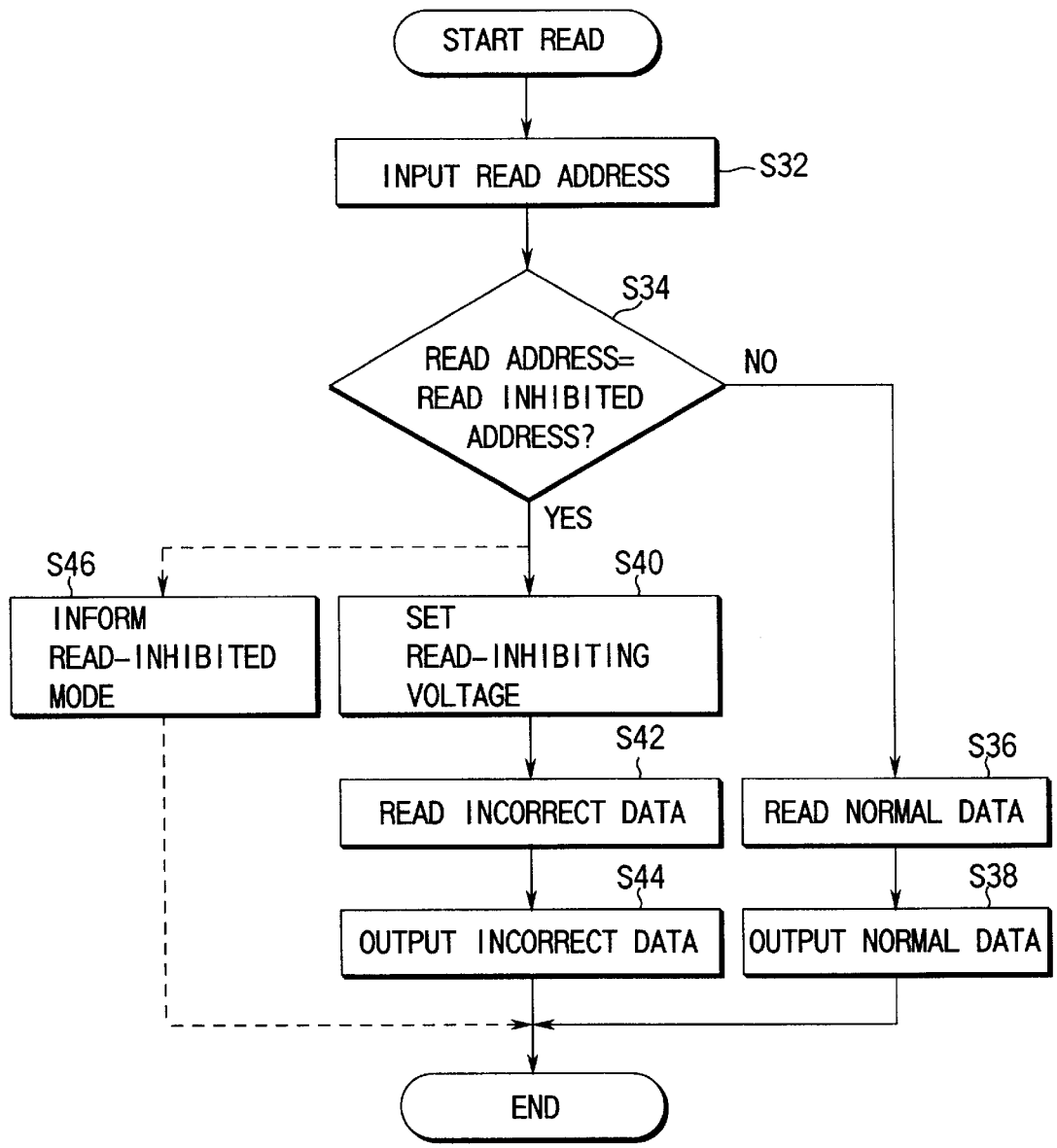
FIG. 15 is a flow chart showing the read operation of the EEPROM according to the eighth embodiment.

FIG. 14A is a flow chart showing an operation of storing addresses to be set in a read-inhibiting state. FIG. 14B is a flow chart showing an operation of resetting the read-inhibiting state of a certain address. FIG. 15 is a flow chart showing a read operation.

Figure 16:
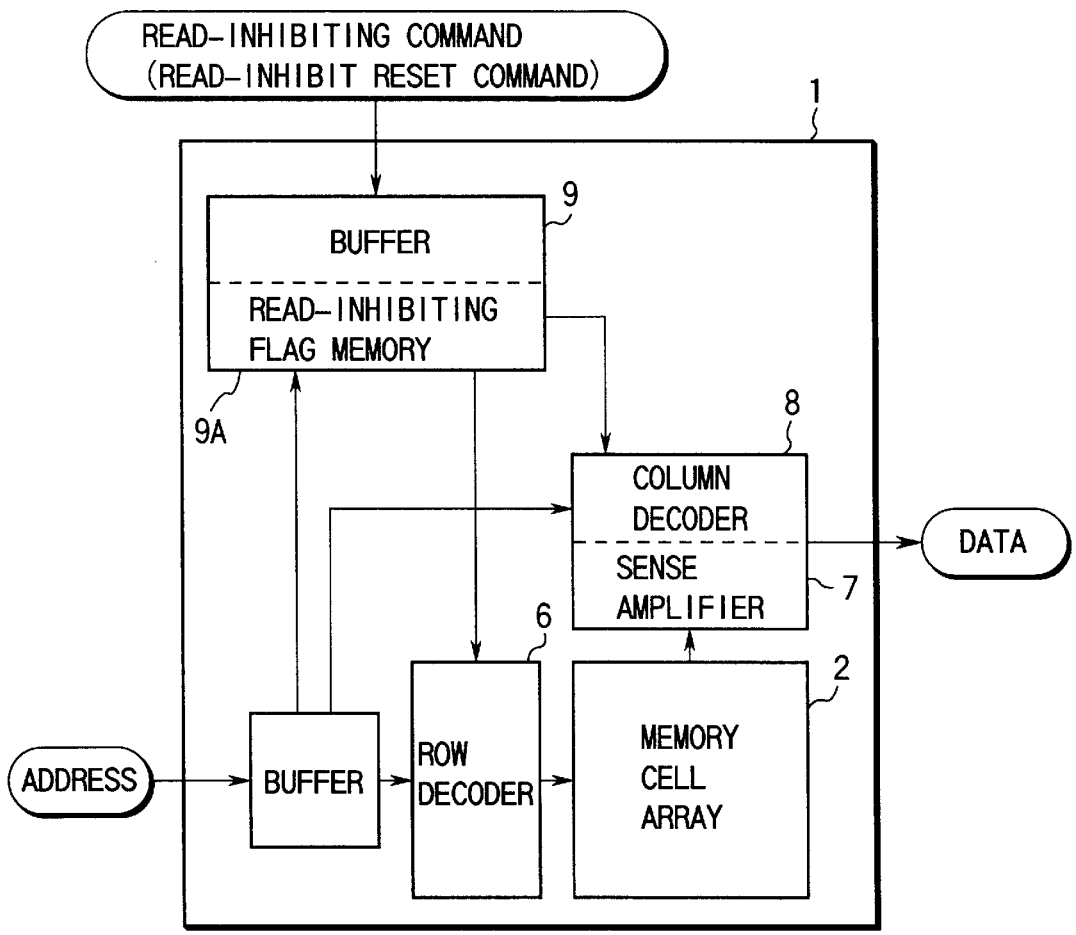
FIG. 16 is a block diagram of the EEPROM according to the eighth embodiment.

FIG. 16 is a block diagram showing the arrangement of an EEPROM which enables the operations shown in FIGS. 14A, 14B, and 15.

Operations of a NAND-type EEPROM of the eighth embodiment will be described below.

Read-inhibiting Address Storage Operation:

As shown in FIG. 14A, at step S12, a read-inhibiting command is input to a memory 9A shown in FIG. 16. A read-inhibiting address is input to the memory 9A at step S14. The read-inhibiting address is written in the memory 9A at step S16.

Read Operation:

As shown in FIG. 15, a read address is input at step S32. At step S34, the input read address is compared to a read-inhibiting address stored in the memory 9A.

If NO at step S34, a normal read operation is performed at step S36, normal data is output at step S38, and the read operation is ended.

If YES at step S34, a read-inhibiting mode is set at step S40. More specifically, a read-inhibiting voltage for the row line as shown in the column of the read-inhibiting operation in FIGS. 5, 6, 8, 9, and 11 is generated. Thereafter, at step S42, the read operation is performed while setting normal read voltages for the remaining row lines. However, since the current path of the NAND cell is cut off, erroneous data (incorrect data) is read out and output at step S44, and the read operation is ended.

If YES at step S34, notification data representing the read-inhibiting mode may be output at step S46, as in the flow indicated by a broken line in FIG. 15, and the read operation may be ended. Notification data representing the read-inhibiting mode may be output from the memory 9A. Alternatively, an area for storing data (flag) representing the read-inhibiting mode may be provided in the memory cell array 2, and this area may be accessed to output the notification data.

Read-inhibiting Address Reset Operation:

As shown in FIG. 14B, a read-inhibit reset command is input to the memory 9A at step S22. Read-inhibit reset address is input to the memory 9A at step S24. At step S26, of read-inhibiting addresses stored in the memory 9A, address corresponding to the read-inhibit reset address is erased. The read-inhibiting command addresses stored in the memory 9A may be simultaneously erased.

In the above EEPROM, when the read address matches the read-inhibiting addresses stored in the memory 9A, a read-inhibiting mode can be set.

The memory 9A may store a read-inhibit reset address instead of the read-inhibiting address. In this case, when the read address matches the read-inhibit reset address stored in the memory 9A, a normal read mode can be set.

(Ninth Embodiment)

An EEPROM of the ninth embodiment includes still another arrangement capable of switching the read-inhibiting operation and normal read operation in the first to fifth embodiments (FIGS. 5, 6, 8, 9, and 11).

In the ninth embodiment, comparison data is input from an external device to a chip 1, and only when the input comparison data matches data in the chip 1, the read-inhibiting operation is reset.

Figure 17:
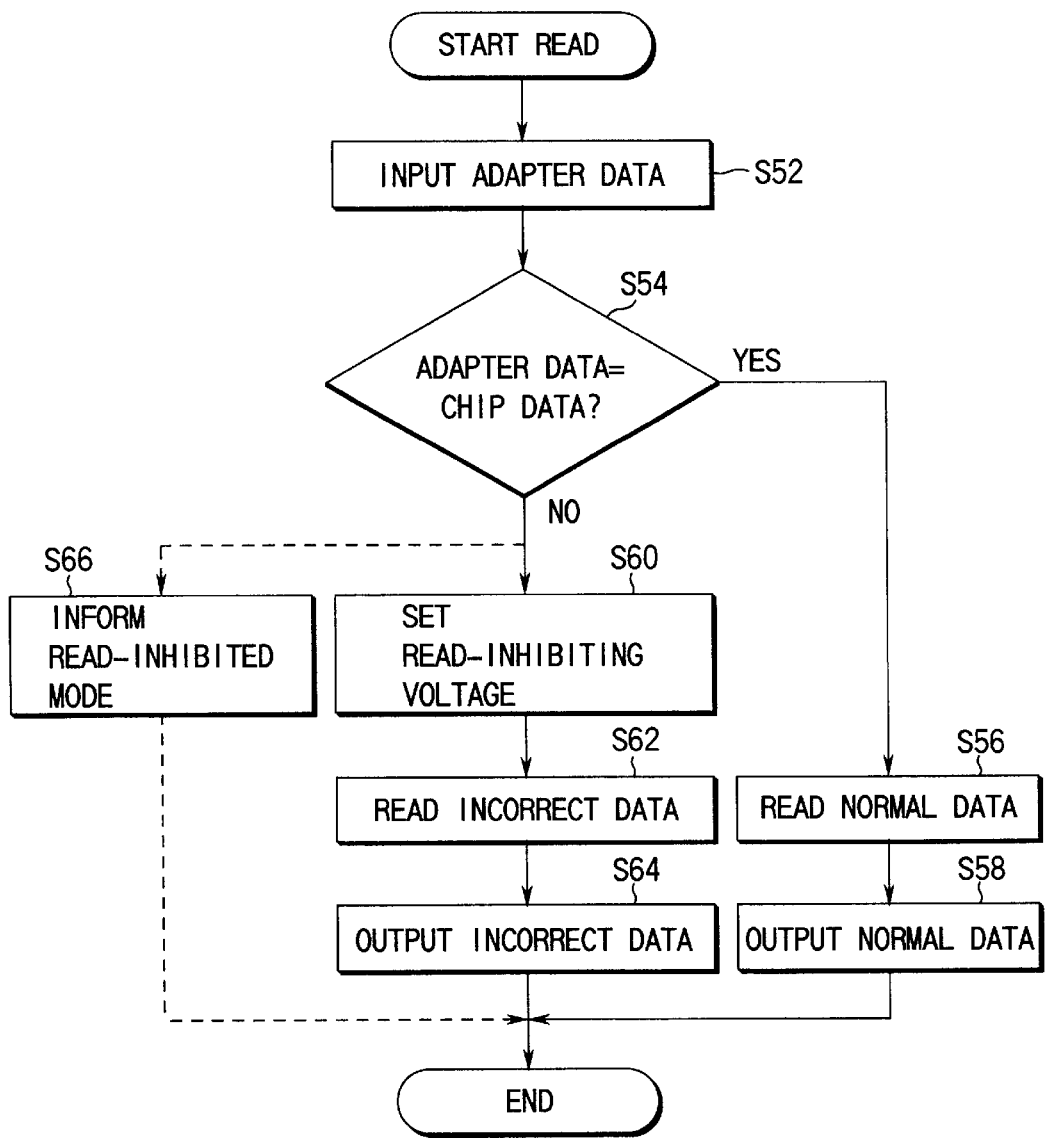
FIG. 17 is a flow chart showing the read operation of an EEPROM according to a ninth embodiment.
Figure 18:
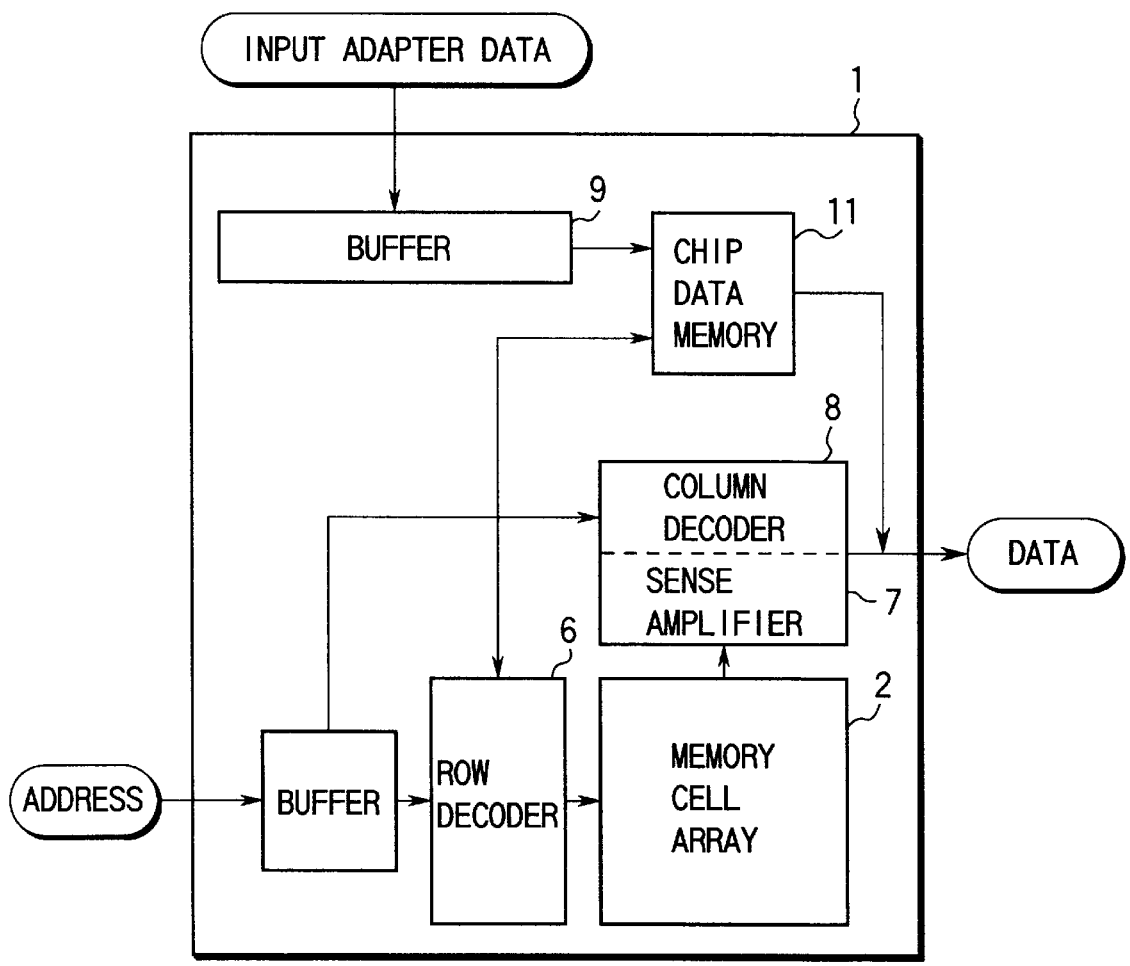
FIG. 18 is a block diagram of the EEPROM according to the ninth embodiment.

FIG. 17 is a flow chart showing the algorithm of the read operation. FIG. 18 is a block diagram showing the arrangement of an EEPROM which enables an operation according to the algorithm shown in FIG. 17.

FIG. 17 explains an example in which adapter data is input from an adapter (CPC) to the chip 1, and the input adapter data is compared with chip data in the chip 1.

Read Operation:

As shown in FIG. 17, at step S52, adapter data is input to a buffer 9 shown in FIG. 18. At step S54, the input adapter data is compared with chip data stored in a storage unit 11.

If YES at step S54, the read-inhibiting operation is reset. A normal read operation is performed at step S56, normal data is output at step S58, and the read operation is ended.

If NO at step S54, a read-inhibiting operation is set at step S60. More specifically, a read-inhibiting voltage for the row line as shown in the column of the read-inhibiting operation in FIGS. 5, 6, 8, 9, and 11 is generated. Thereafter, at step S62, the read operation is performed while setting normal read voltages for the remaining row lines. Since the current path of the NAND cell is cut off, erroneous data (incorrect data) is read out and output at step S64, and the read operation is ended.

If YES at step S54, notification data representing the read-inhibiting mode may be output at step S66, as in the flow indicated by a broken line in FIG. 17, and the read operation may be ended. As in the eighth embodiment, notification data representing the read-inhibiting mode may be output from a memory 9A. Alternatively, an area for storing data (flag) representing the read-inhibiting mode may be arranged in a memory cell array 2, and this area may be accessed to output the notification data.

Figure 19:
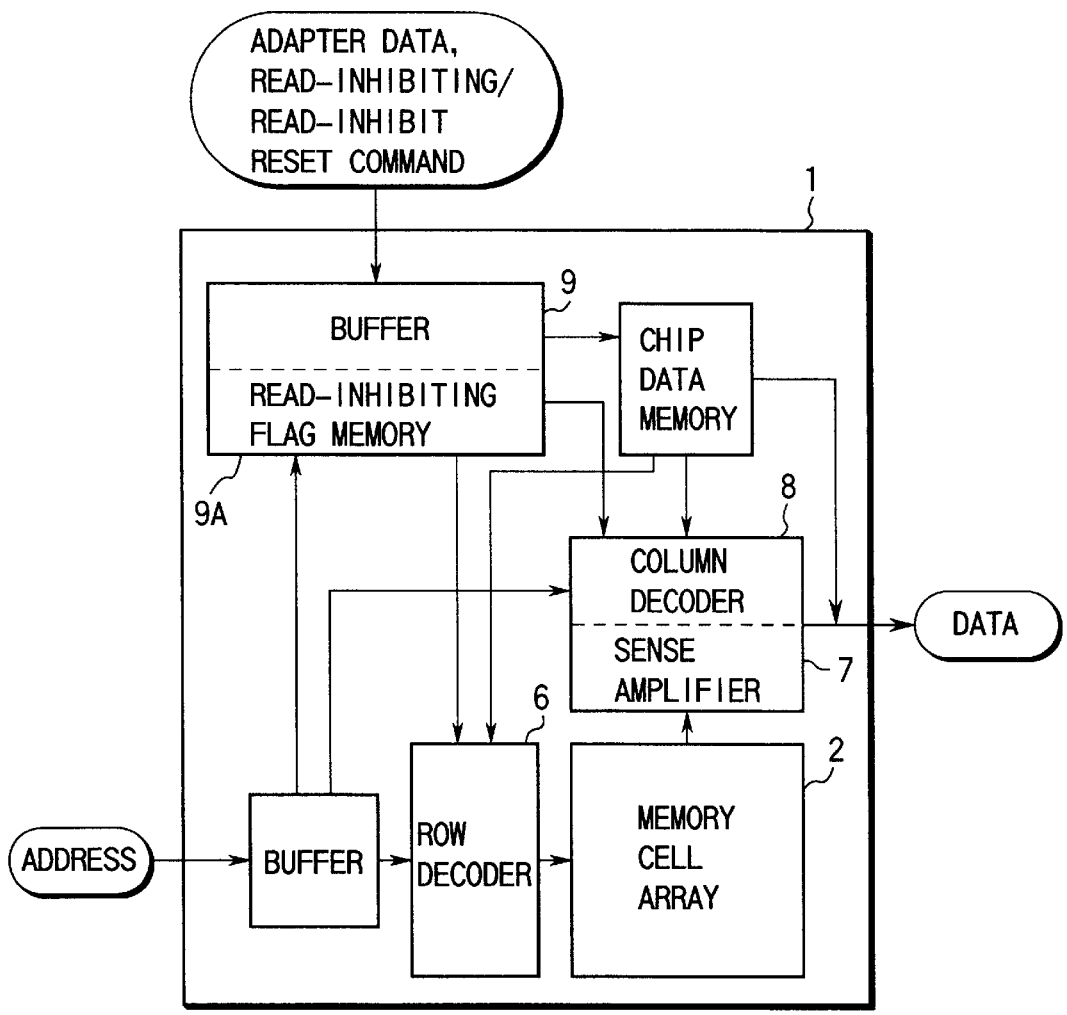
FIG. 19 is a block diagram of a modification of the EEPROM according to the ninth embodiment.

The ninth embodiment in which input adapter data is compared with chip data can be combined with the sixth to eighth embodiments. FIG. 19 shows a combination of the ninth embodiment and the eighth embodiment.

In the above EEPROM, when the input adapter data matches the chip data, the read-inhibiting state can be reset. Therefore, only when a specific adapter is used, the data can be read out, so the confidentiality of the data is ensured.

Figure 20:
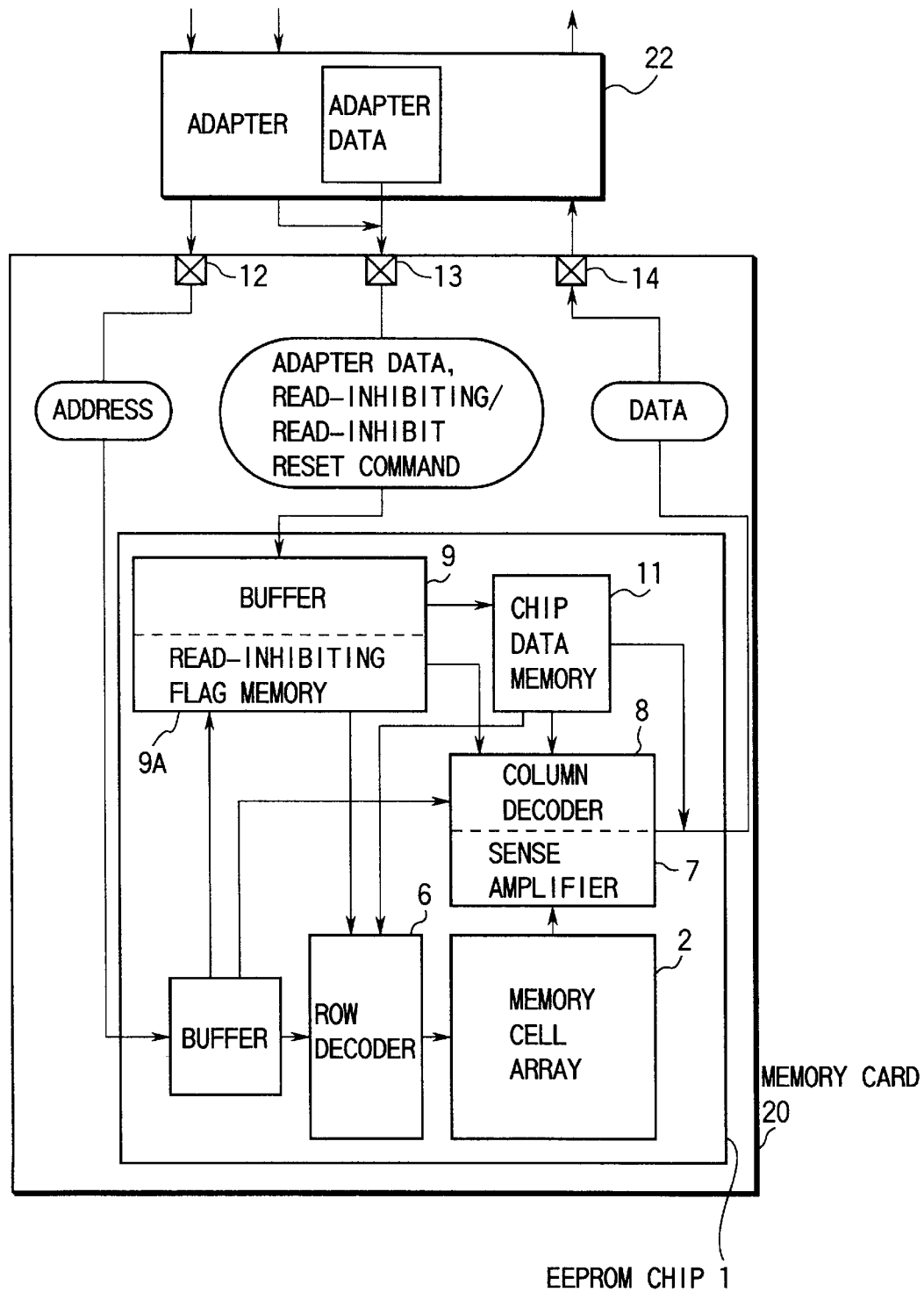
FIG. 20 is a block diagram showing a memory card system having the EEPROM according to the ninth embodiment.

FIG. 20 shows a memory card system having the EEPROM according to the ninth embodiment.

As shown in FIG. 20, a memory card 20 as an integrated circuit type storage medium includes the EEPROM chip 1 shown in FIG. 19. The memory card 20 includes external terminals 12, 13, and 14. The external terminal 12 receives an address input through an adapter 22. The external terminal 13 receives a read-inhibiting/read-inhibit reset command through the adapter 22 and adapter data from the adapter 22. The external terminal 14 receives a data output, and this data output is supplied to the adapter 22 through the external terminal 14.

When the EEPROM according to the ninth embodiment is loaded in, e.g., the memory card 20, data can be read out from the card 20 only when the specific adapter 22 is used. Therefore, the confidentiality of the data in the card 20 is ensured.

Figure 21:
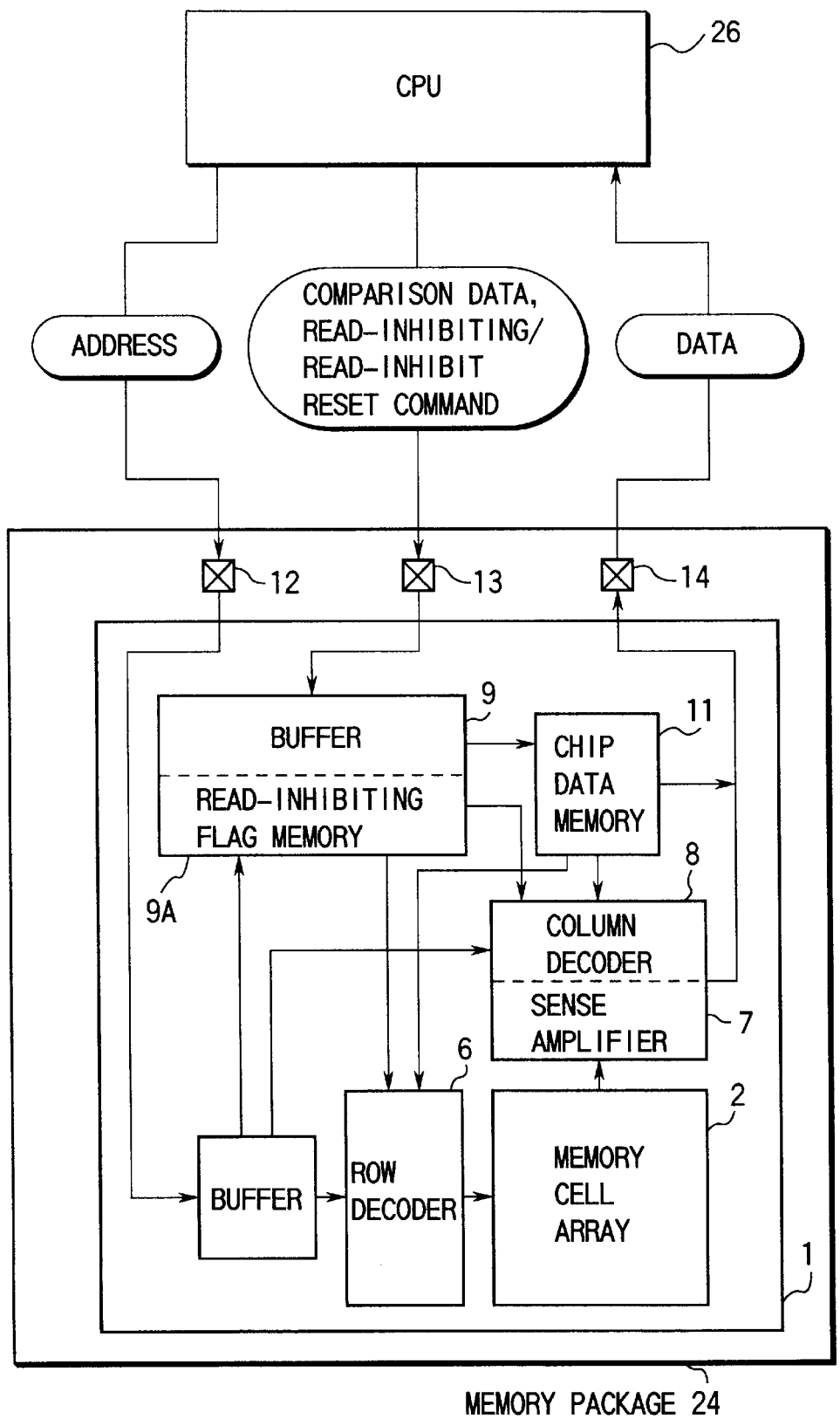
FIG. 21 is a block diagram showing a memory system having the EEPROM according to the ninth embodiment.

The adapter may be replaced with a CPU, comparison data may be input from the CPU, and the input comparison data may be compared with chip data. FIG. 21 shows a memory system using the EEPROM according to the ninth embodiment in which the adapter is replaced with a CPU.

As shown in FIG. 21, a memory package 24 as an integrated circuit type storage medium incorporates the EEPROM chip 1 shown in FIG. 19. The package 24 includes the external terminals 12, 13, and 14. The external terminal 12 receives an address input from a CPU 26 as a processing unit. The external terminal 13 receives read-inhibiting/read-inhibit reset command and comparison data from the CPU 26. The external terminal 14 receives a data output, and this data output is supplied to the CPU 26 through the external terminal 14.

As shown in FIG. 21, in the memory system using the EEPROM according to the ninth embodiment, only when the CPU 26 of the system transmits specific comparison data, the data can be read out. Therefore, the confidentiality of the data in the system is ensured.

(Tenth Embodiment)

Figure 22:
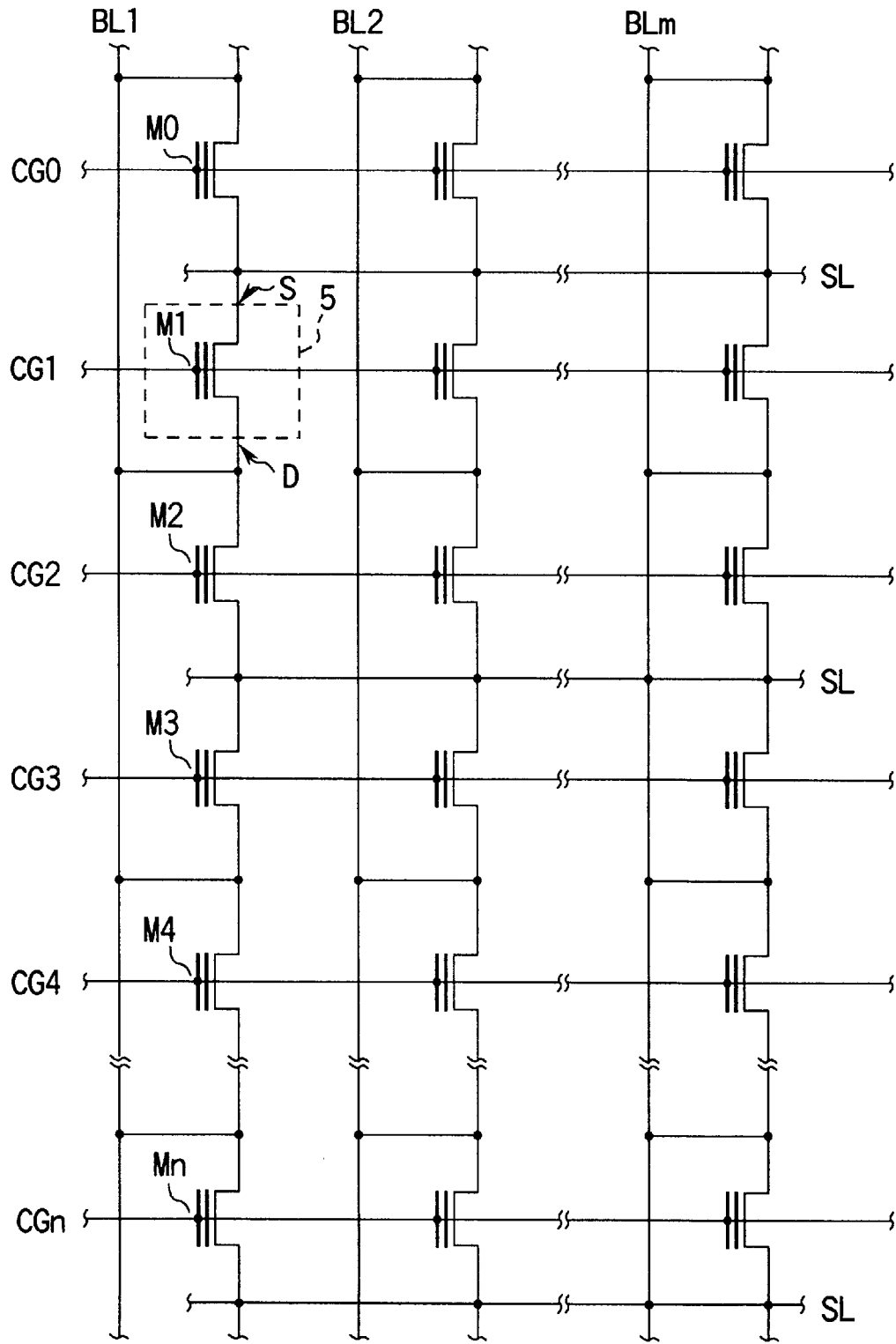
FIG. 22 is an equivalent circuit diagram of a NOR-type EEPROM according to a tenth embodiment of the present invention.

FIG. 22 is an equivalent circuit diagram of a memory cell array 2 of a NOR-type EEPROM according to the tenth embodiment of the present invention.

The memory cell array 2 of the NOR-type EEPROM is characterized in that a memory cell 5 is constituted by one memory transistor or one memory transistor and a selection transistor for selecting this memory transistor.

As shown in FIG. 22, a read-inhibiting gate CG0 is arranged to be parallel to control gates CG1 to CGn. The read-inhibiting gate CG0 short-circuits a bit line BL to a source line SL during a read-inhibiting operation. In the tenth embodiment, a memory transistor M0 is connected to the read-inhibiting gate CG0.

Operations of the NOR-type EEPROM of the tenth embodiment will be described below assuming that, of the four control gates CG1 to CG4 (n=4), the control gate CG2 is selected to read out data from a memory transistor M2 connected to the control gate CG2.

FIG. 23 shows a voltage relationship for the respective operations of the NOR-type EEPROM according to the tenth embodiment.

Simultaneous Erase Operation:

As shown in FIG. 23, a voltage of 0 V or 12 V is applied to the read-inhibiting gate CG0, or the read-inhibiting gate CG0 is set in a floating state.

Voltage relationships for gates other than the read-inhibiting gate CG0 are the same as those in the conventional simultaneous erase operation, as shown in FIG. 23.

Alternatively, a negative voltage of, e.g., about −8 V may be applied to the control gates CG1 to CG4, and the voltage of the source line SL may be set at a positive voltage of, e.g., about 4 V to erase data.

Selective Write Operation:

As shown in FIG. 23, a voltage of 0 V is applied to the read-inhibiting gate CG0. Voltage relationships for gates other than the read-inhibiting gate CG0 are the same as those in the conventional selective write operation, as shown in FIG. 23.

Normal Read Operation:

As shown in FIG. 23, a voltage of 0 V is applied to the read-inhibiting gate CG0 to turn off the transistor M0 having the read-inhibiting gate CG0 as its gate. Voltage relationships for gates other than the read-inhibiting gate CG0 are the same as those in the conventional read operation, as shown in FIG. 23, and data can be normally read out.

Read-inhibiting Operation:

As shown in FIG. 23, a voltage of 10 V is applied to the read-inhibiting gate CG0 to forcibly turn on the memory transistor M0 having the read-inhibiting gate CG0 as its gate. With this operation, the bit line BL is short-circuited to the source line SL, so data cannot be normally read out even when voltage relationships for gates other than the read-inhibiting gate CG0 are the same as those in the normal read operation, as shown in FIG. 23.

(Eleventh Embodiment)

The equivalent circuit diagram of the eleventh embodiment is the same as that of the tenth embodiment. In the eleventh embodiment, however, data for identifying the normal read operation or read-inhibiting operation is stored in a memory transistor M0 connected to a read-inhibiting gate CG0 in advance. This identifying data is the same as that of the fourth embodiment for the NAND-type EEPROM.

FIG. 24 shows a voltage relationship for the respective operations of a NOR-type EEPROM according to the eleventh embodiment.

Simultaneous Erase Operation:

The simultaneous erase operation is the same as in the tenth embodiment shown in FIG. 23.

Selective Write Operation:

The selective write operation is the same as in the tenth embodiment shown in FIG. 23.

Normal Read Operation:

As shown in FIG. 24, a voltage of 0 V is applied to the read-inhibiting gate CG0 to turn off the memory transistor M0 having the read-inhibiting gate CG0 as its gate. Voltage relationships for gates other than the read-inhibiting gate CG0 are the same as those in the conventional read operation, as shown in FIG. 24, so data can be normally read out.

Read-inhibiting Operation:

As shown in FIG. 24, a voltage of 5 V is applied to the read-inhibiting gate CG0. This voltage equals the voltage of a control gate CG2 shown in the column of the normal read operation in FIG. 24, i.e., the read reference voltage.

If the threshold voltage of the memory transistor M0 is lower than the read reference voltage of 5 V (if data causing the memory transistor M0 to be turned on upon application of a voltage of 5 V to the read-inhibiting gate CG0 is stored in the transistor M0 in advance), the memory transistor M0 is turned on. In this case, read access is inhibited, so data cannot be normally read out even when voltage relationships for gates other than the read-inhibiting gate CG0 are the same as those in the normal read operation, as shown in FIG. 24.

If the threshold voltage of the memory transistor M0 is higher than the read reference voltage of 5 V (if data causing the memory transistor M0 to be turned off upon application of a voltage of 0 V to the read-inhibiting gate CG0 is stored in the transistor M0 in advance), the memory transistor M0 is turned off. In this case, when voltage relationships for gates other than the read-inhibiting gate CG0 are the same as those in the normal read operation, data can be normally read out.

In the eleventh embodiment, when a voltage of 0 V is applied to the read-inhibiting gate CG0, the memory transistor M0 is turned off independently of data stored in the transistor M0. Therefore, the stored read-inhibiting state can be avoided, as needed.

(Twelfth Embodiment)

Figure 25:
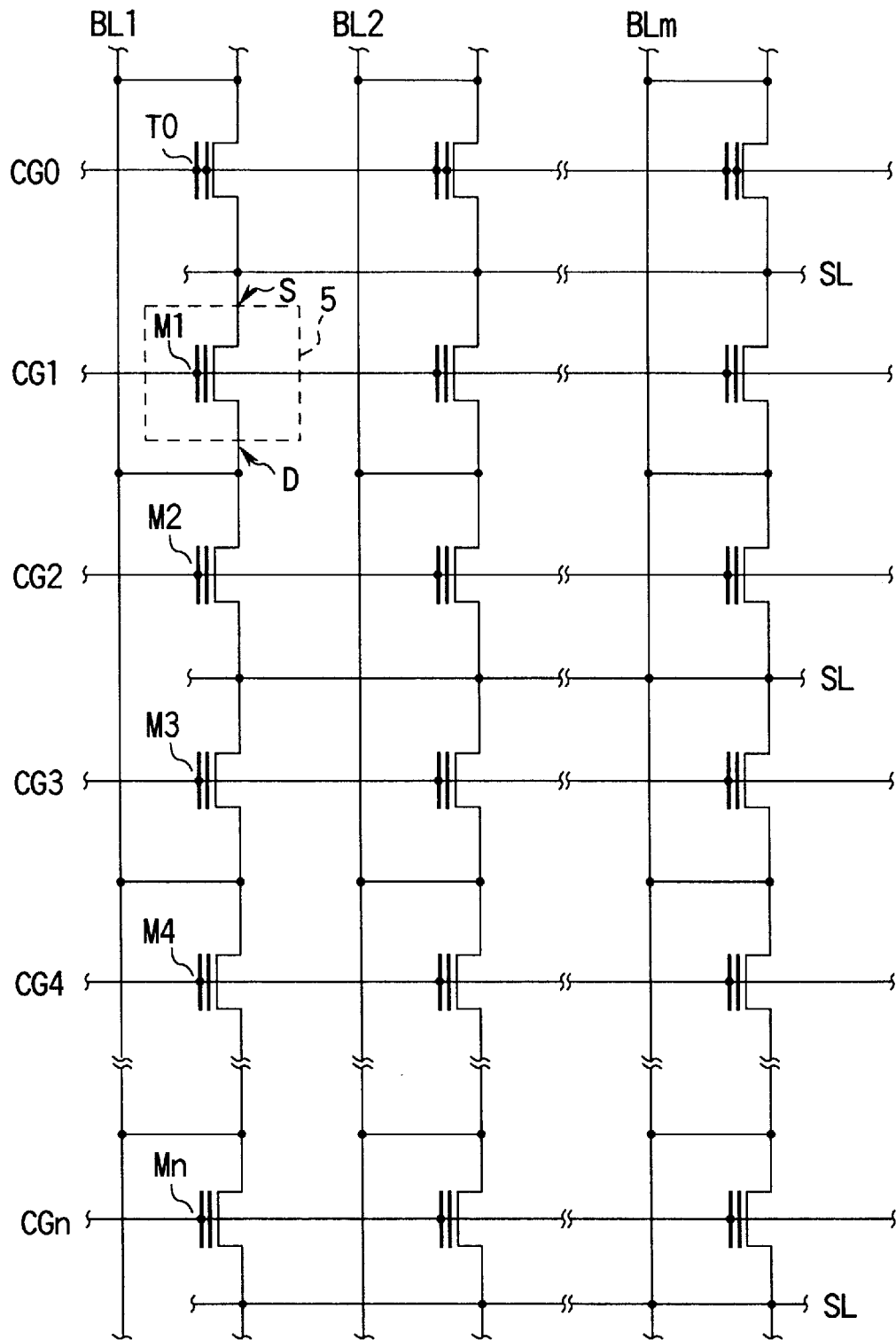
FIG. 25 is an equivalent circuit diagram of a NOR-type EEPROM according to a twelfth embodiment of the present invention.

FIG. 25 is an equivalent circuit diagram of a memory cell array 2 of a NOR-type EEPROM according to the twelfth embodiment.

As shown in FIG. 25, in the twelfth embodiment, not a memory transistor but a transistor T0 is connected to a read-inhibiting gate CG0. The transistor T0 includes a normal transistor structure or a structure in which the floating gate portion of a memory transistor is short-circuited to a control gate, as shown in FIG. 25.

Operations of the NOR-type EEPROM of the twelfth embodiment will be described below assuming that, of four control gates CG1 to CG4 (n=4), the control gate CG2 is selected to read out data from a memory transistor M2 connected to the control gate CG2.

FIG. 26 shows a voltage relationship for the respective operations of the NOR-type EEPROM according to the twelfth embodiment.

Simultaneous Erase Operation:

As shown in FIG. 26, a voltage of 0 V or 12 V is applied to the read-inhibiting gate CG0, or the read-inhibiting gate CG0 is set in a floating state.

Voltage relationships for gates other than the read-inhibiting gate CG0 are the same as those in the conventional simultaneous erase operation, as shown in FIG. 26.

Selective Write Operation:

As shown in FIG. 26, a voltage of 0 V is applied to the read-inhibiting gate CG0. Voltage relationships for gates other than the read-inhibiting gate CG0 are the same as those in the conventional selective write operation, as shown in FIG. 26.

Normal Read Operation:

As shown in FIG. 26, a voltage of 0 V is applied to the read-inhibiting gate CG0 to turn off the transistor T0 having the read-inhibiting gate CG0 as its gate. Voltage relationships for gates other than the read-inhibiting gate CG0 are the same as those in the conventional read operation, as shown in FIG. 26, and data can be normally read out.

Read-inhibiting Operation:

As shown in FIG. 26, a voltage of 5 V is applied to the read-inhibiting gate CG0 to turn on the transistor T0 having the read-inhibiting gate CG0 as its gate. With this operation, a bit line BL is short-circuited to a source line SL, so data cannot be normally read out even when voltage relationships for gates other than the read-inhibiting gate CG0 are the same as those in the normal read operation, as shown in FIG. 26.

(Thirteenth Embodiment)

Figure 27:
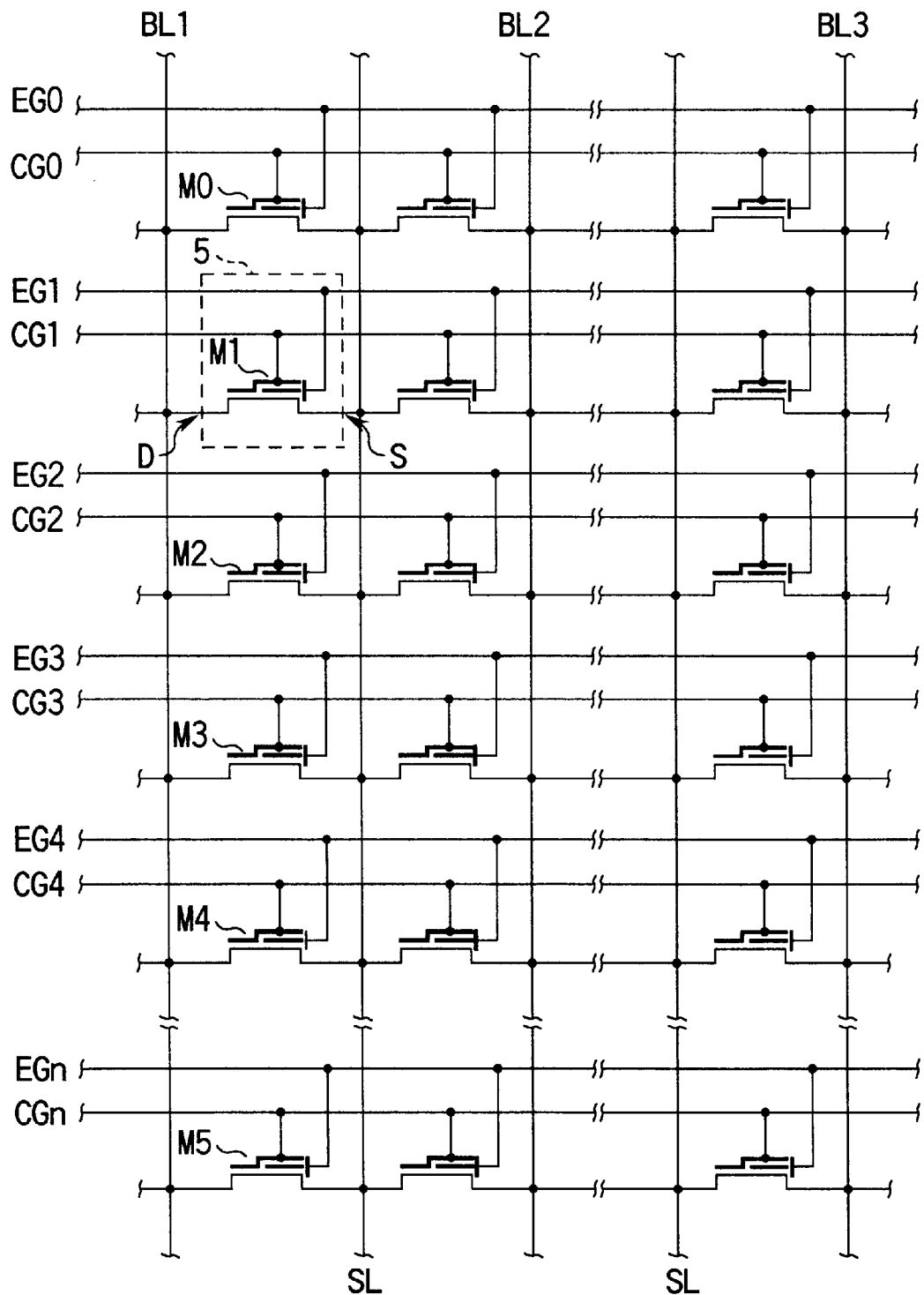
FIG. 27 is an equivalent circuit diagram of a ground array type EEPROM according to a thirteenth embodiment of the present invention.

FIG. 27 is an equivalent circuit diagram of a memory cell array 2 of a NOR-type EEPROM according to the thirteenth embodiment of the present invention.

The EEPROM shown in FIG. 27 is called a ground array EEPROM. The ground array EEPROM is basically of a NOR type. Therefore, the read-inhibiting operation can be realized on the basis of the same process as in the twelfth embodiment. For example, a voltage as shown in the column of the read-inhibiting operation in FIG. 23, 24, or 26 may be set for a read-inhibiting gate CG0 such that a memory transistor M0 connected to the read-inhibiting gate CG0 shown in FIG. 27 is turned on, and a bit line BL is short-circuited to a source line SL.

The ground array EEPROM shown in FIG. 27 includes an erase gate EG. However, even in a ground array EEPROM having no erase gate EG, a voltage as shown in the column of the read-inhibiting operation in FIG. 23, 24, or 26 may be set for the read-inhibiting gate CG0.

The ground array EEPROM shown in FIG. 27 is a split channel type ground array EEPROM in which some control gates are offset from the floating gate in the direction of channel length. However, even in a ground array EEPROM of another type, a voltage as shown in the column of the read-inhibiting operation in FIG. 23, 24, or 26 may be set for the read-inhibiting gate CG0.

(Fourteenth Embodiment)

Figure 28:
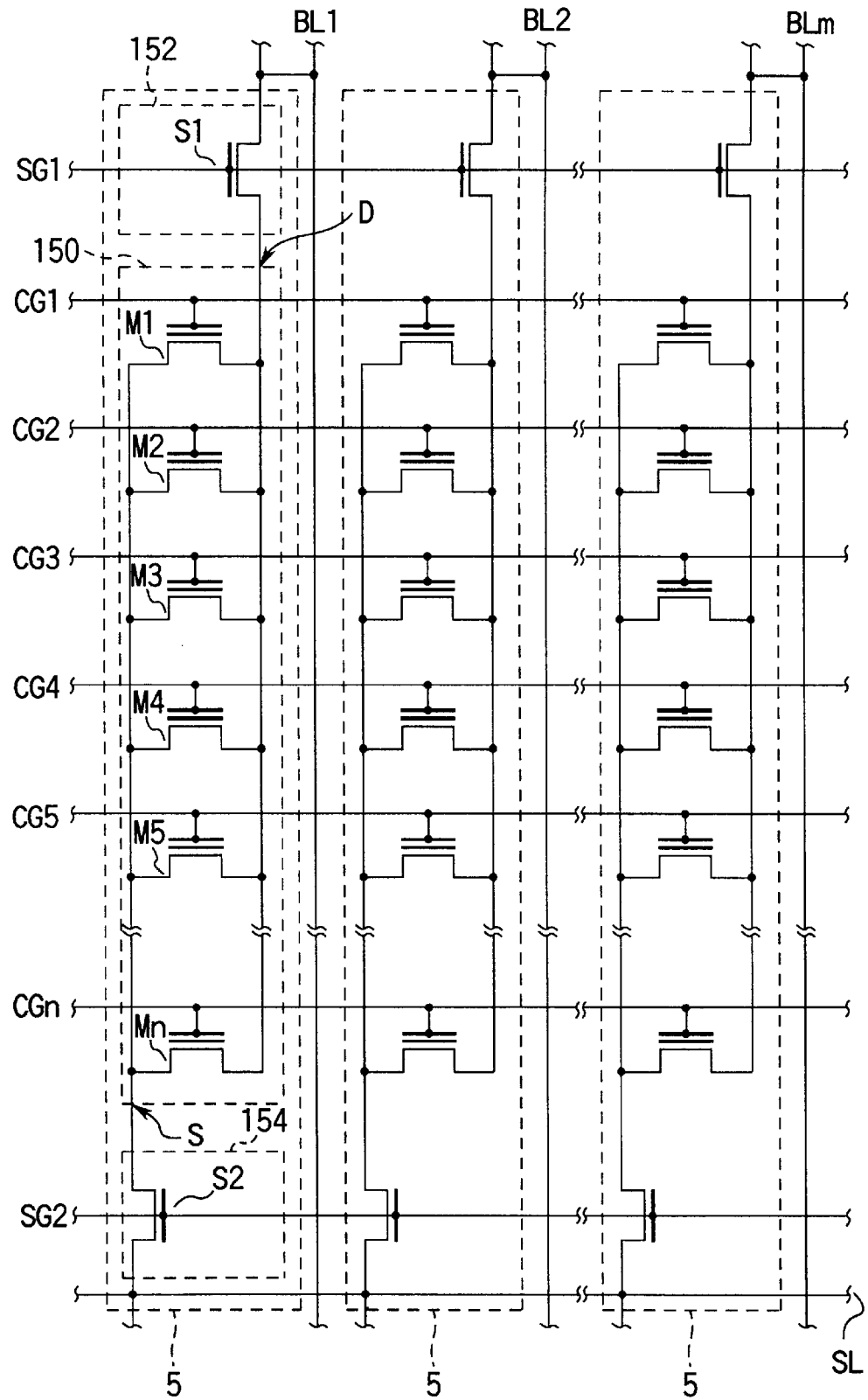
FIG. 28 is an equivalent circuit diagram of an AND-type EEPROM according to a fourteenth embodiment of the present invention.

FIG. 28 is an equivalent circuit diagram of a memory cell array 2 of an AND-type EEPROM according to the fourteenth embodiment of the present invention.

The memory cell array 2 of the AND-type EEPROM is characterized in that a memory cell 5 includes a unit cell (to be referred to as a NOR cell hereinafter) constituted by a plurality of memory transistors which are connected in parallel.

As shown in FIG. 28, the memory cell 5 includes a NOR cell 150 formed of a plurality of memory transistors M1 to Mn which are connected in parallel, a drain-side selection gate 152 formed of a selection transistor S1 connected in series between a drain terminal D of the NOR cell 150 and a bit line BL1, and a source-side selection gate 154 formed of a selection transistor S2 connected in series between a source terminal S of the NOR cell 150 and a source line SL.

In the AND-type EEPROM, one word line WL shown in FIG. 1 corresponds to a plurality of control gates CG1 to CGn. One bit line BL corresponds to one bit line (BL1 or BL2).

Operations of the AND-type EEPROM of the fourteenth embodiment will be described below assuming that, of the four control gates CG1 to CG4 (n=4), the control gate CG2 is selected to read out data from the memory transistor M2 connected to the control gate CG2.

FIG. 29 shows a voltage relationship for the respective operations of the AND-type EEPROM according to the fourteenth embodiment.

As shown in FIG. 29, in the fourteenth embodiment, the simultaneous erase operation and selective write operation may be the same as the conventional operations, and only operations different from the conventional operations will be described below in detail.

Normal Read Operation:

As shown in FIG. 29, in the normal read operation, a voltage of 5 V (power supply voltage Vcc) is applied to the selection gates SG1 and SG2 to turn on the selection transistors S1 and S2, respectively. A read reference voltage of 3 V is applied to the control gate CG2 selected for read access, and a voltage of 0 V is applied to the non-selected control gates CG1, CG3, and CG4, so the memory transistors M1, M3, and M4 are turned off.

The memory transistor M2 is turned on when the threshold voltage is lower than the read reference voltage of 3 V and turned off when it is higher than the read reference voltage of 3 V. With this arrangement, data of level "0" and data of level "1" are discriminated.

Read-inhibiting Operation:

As shown in FIG. 29, in the read-inhibiting operation, a voltage for forcibly turning on memory transistors is applied to at least one of the non-selected control gates CG1, CG3, and CG4 independently of the presence/absence of electrons in the floating gate of the memory transistor. The voltage for forcibly turning on the memory transistor is, e.g., 6 V.

When this voltage of 6 V is applied to, e.g., the control gate CG1, the transistor M1 is turned on to short-circuit the source terminal S of the NOR cell 150 to the drain terminal D during the read-inhibiting operation. Therefore, no normal data can be read out from the memory transistor M2 to be accessed.

In the read-inhibiting operation of the fourteenth embodiment, the voltage (to be referred to as a read-inhibiting voltage hereinafter) for forcibly turning on the memory transistor is applied to the non-selected control gate CG1, as shown in FIG. 29. This read-inhibiting voltage can be applied to the non-selected control gate CG3 or CG4. The read-inhibiting voltage can be applied to the plurality of non-selected control gates.

In this case, the read-inhibiting voltage is set at 6 V, as shown in FIG. 29. However, it may be a voltage which can forcibly turn off the memory transistor, i.e., a voltage higher than the highest one of some threshold voltages of the memory transistor. When the highest threshold voltage of the memory transistor is 3 V or less, the read-inhibiting voltage may be 3 V.

(Fifteenth Embodiment)

The fifteenth embodiment is different from the fourteenth embodiment in that, instead of turning on a memory transistor to short-circuit a source terminal S of a NOR cell 150 to a drain terminal D, a selection gate is forcibly turned off to cut off the current path between the NOR cell and a bit line, thereby inhibiting read access.

FIG. 30 shows a voltage relationship for the respective operations of an AND-type EEPROM according to the fifteenth embodiment.

Normal Read Operation:

The normal read operation is the same as in the fourteenth embodiment shown in FIG. 29.

Read-inhibiting Operation:

As shown in FIG. 30, in the read-inhibiting operation, a voltage for turning off selection transistors S1 and S2 is applied to selection gates SG1 and SG2. The voltage for turning off the selection transistors S1 and S2 is, e.g., 0 V. When such a voltage of 0 V is applied to the selection gates SG1 and SG2, the current path between the NOR cell and the bit line is cut off during the read-inhibiting operation. Therefore, no normal data can be read out from a memory transistor M2 to be accessed, as in the fourteenth embodiment.

In the read-inhibiting operation of the fifteenth embodiment, the voltage for turning off the selection transistors S1 and S2 is applied to the selection gates SG1 and SG2, as shown in FIG. 30. However, a voltage for turning off one of the selection transistors may be applied to one of the selection gates SG1 and SG2.

(Sixteenth Embodiment)

The read-inhibiting state is realized by forcibly turning on some of non-selected control gates in the fourteenth embodiment and by forcibly turning off control gates in the fifteenth embodiment. In an AND-type EEPROM according to the sixteenth embodiment, a read-inhibiting gate for inhibiting read access is independently arranged in a memory cell array 2.

Figure 31:
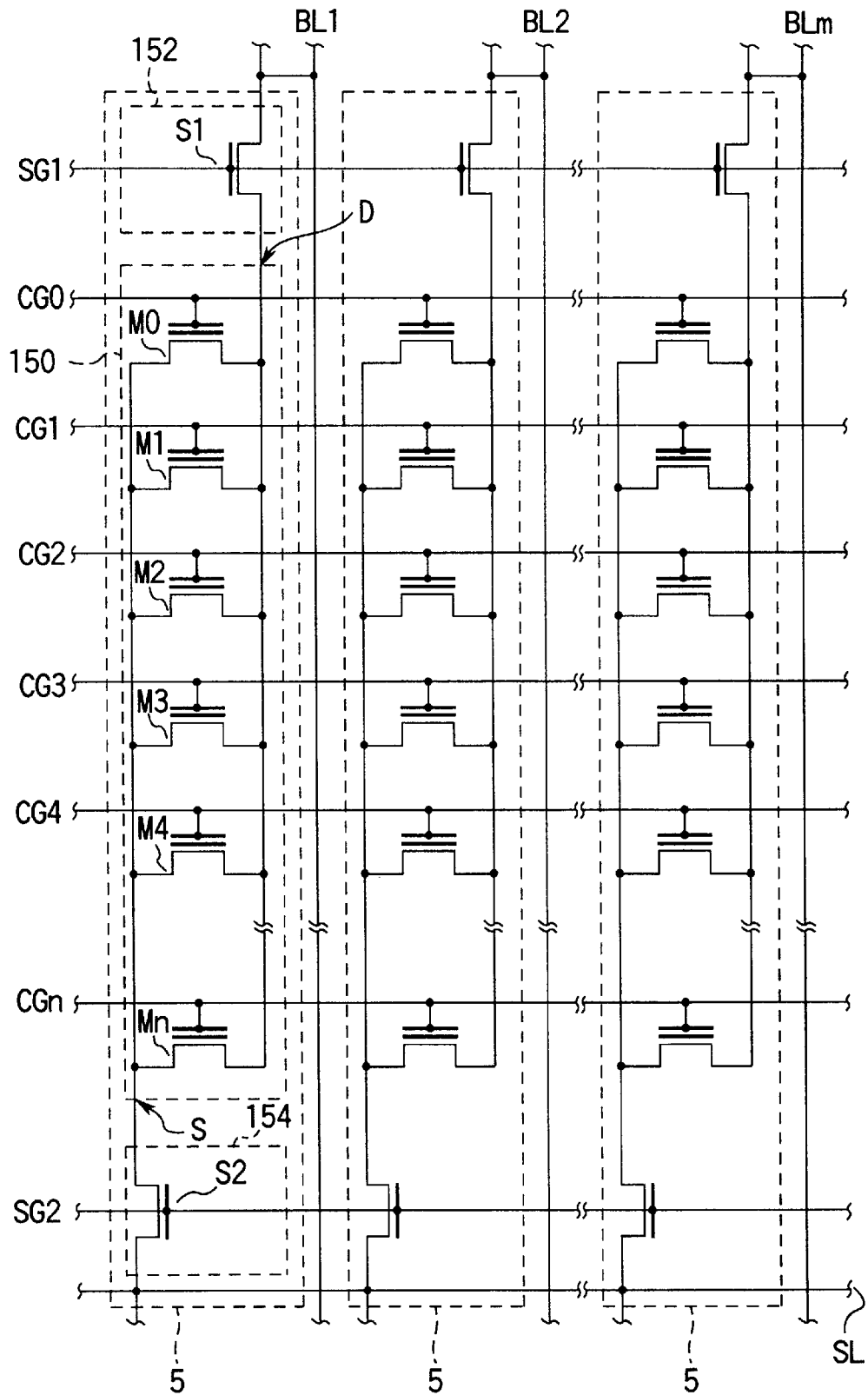
FIG. 31 is an equivalent circuit diagram of an AND-type EEPROM according to a sixteenth embodiment of the present invention.

FIG. 31 is an equivalent circuit diagram of the memory cell array 2 of the AND-type EEPROM according to the sixteenth embodiment.

As shown in FIG. 31, a read-inhibiting gate CG0 is arranged to be parallel to, e.g., control gates CG1 to CGn. In the read-inhibiting operation, a transistor connected to the read-inhibiting gate CG0 short-circuits a source terminal S of the NOR cell to a drain terminal D. In the sixteenth embodiment, the transistor connected to the read-inhibiting gate CG0 includes the same structure as that of memory transistors.

Operations of the AND-type EEPROM of the sixteenth embodiment will be described below assuming that, of the four control gates CG1 to CG4 (n=4), the control gate CG2 is selected to read out data from a memory transistor M2 connected to the control gate CG2.

FIG. 32 shows a voltage relationship for the respective operations of the AND-type EEPROM according to the sixteenth embodiment.

Simultaneous Erase Operation:

As shown in FIG. 32, a voltage of 15 V is applied to the read-inhibiting gate CG0. Voltage relationships for gates other than the read-inhibiting gate CG0 are the same as those in the conventional simultaneous erase operation, as shown in FIG. 32.

Selective Write Operation:

As shown in FIG. 32, a voltage of 0 V is applied to the read-inhibiting gate CG0. Voltage relationships for gates other than the read-inhibiting gate CG0 are the same as those in the conventional selective write operation, as shown in FIG. 32.

Normal Read Operation:

As shown in FIG. 32, a voltage of 0 V is applied to the read-inhibiting gate CG0 to turn off a memory transistor M0 having the read-inhibiting gate CG0 as its gate. Voltage relationships for gates other than the read-inhibiting gate CG0 are the same as those in the conventional read operation, as shown in FIG. 32, and data can be normally read out.

Read-inhibiting Operation:

As shown in FIG. 32, a voltage of 6 V is applied to the read-inhibiting gate CG0 to forcibly turn on the memory transistor M0 having the read-inhibiting gate CG0 as its gate. With this operation, the source terminal S of the NOR cell is short-circuited to the drain terminal D, so data cannot be normally read out even when voltage relationships for gates other than the read-inhibiting gate CG0 are the same as those in the conventional normal read operation, as shown in FIG. 32.

(Seventeenth Embodiment)

The equivalent circuit diagram of the seventeenth embodiment is the same as that of the sixteenth embodiment. In the seventeenth embodiment, however, data for identifying the normal read operation or read-inhibiting operation is stored in a memory transistor connected to a read-inhibiting gate.

FIG. 33 shows a voltage relationship for the respective operations of an AND-type EEPROM according to the seventeenth embodiment.

Simultaneous Erase Operation:

The simultaneous erase operation is the same as in the sixteenth embodiment shown in FIG. 32.

Selective Write Operation:

The selective write operation is the same as in the sixteenth embodiment shown in FIG. 32.

Normal Read Operation:

As shown in FIG. 33, a voltage of 0 V is applied to a read-inhibiting gate CG0 to turn off the memory transistor M0 having the read-inhibiting gate CG0 as its gate. Voltage relationships for gates other than the read-inhibiting gate CG0 are the same as those in the conventional read operation, as shown in FIG. 33, so data can be normally read out.

Read-inhibiting Operation:

As shown in FIG. 33, a voltage of 3 V is applied to the read-inhibiting gate CG0. This voltage equals the voltage of a control gate CG2 shown in the column of the normal read operation in FIG. 33, i.e., the read reference voltage.

If the threshold voltage of the memory transistor M0 is lower than the read reference voltage of 3 V (if data causing the memory transistor M0 to be turned on upon application of a voltage of 3 V to the read-inhibiting gate CG0 is stored in the transistor M0 in advance), the memory transistor M0 is turned on. In this case, read access is inhibited, so data cannot be normally read out even when voltage relationships for gates other than the read-inhibiting gate CG0 are the same as those in the normal read operation, as shown in FIG. 33.

If the threshold voltage of the memory transistor M0 is higher than the read reference voltage of 3 V (if data causing the memory transistor M0 to be turned off upon application of a voltage of 0 V to the read-inhibiting gate CG0 is stored in the transistor M0 in advance), the memory transistor M0 is turned off. In this case, when voltage relationships for gates other than the read-inhibiting gate CG0 are the same as those in the normal read operation, data can be normally read out.

In the seventeenth embodiment, when a voltage of 0 V is applied to the read-inhibiting gate CG0, the memory transistor M0 is turned off independently of data stored in the transistor M0. Therefore, the stored read-inhibiting state can be avoided, as needed.

(Eighteenth Embodiment)

Figure 34:
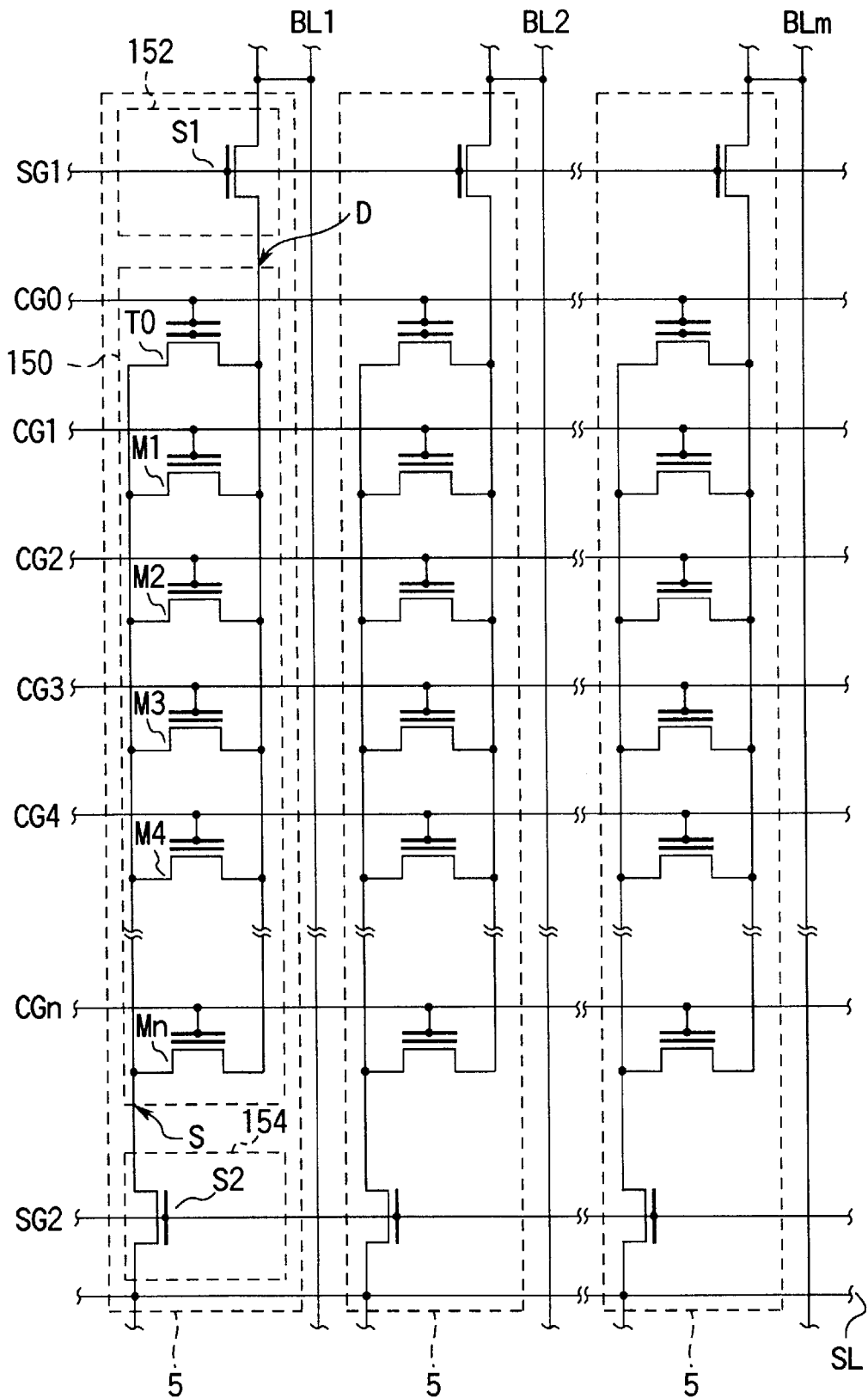
FIG. 34 is an equivalent circuit diagram of an AND-type EEPROM according to an eighteenth embodiment of the present invention.

FIG. 34 is an equivalent circuit diagram of a memory cell array 2 of an AND-type EEPROM according to the eighteenth embodiment.

As shown in FIG. 34, the eighteenth embodiment is a modification of the sixteenth embodiment. In the eighteenth embodiment, not a memory transistor but a transistor T0 is connected to a read-inhibiting gate CG0. The transistor T0 includes a normal transistor structure or a structure in which the floating gate portion of a memory transistor is short-circuited to a control gate, as shown in FIG. 34.

Operations of the AND-type EEPROM of the eighteenth embodiment will be described below assuming that, of four control gates CG1 to CG4 (n=4), the control gate CG2 is selected to read out data from a memory transistor M2 connected to the control gate CG2.

FIG. 35 shows a voltage relationship for the respective operations of the AND-type EEPROM according to the eighteenth embodiment.

Simultaneous Erase Operation:

As shown in FIG. 35, a voltage of 15 V is applied to the read-inhibiting gate CG0. Voltage relationships for gates other than the read-inhibiting gate CG0 are the same as those in the conventional simultaneous erase operation, as shown in FIG. 35.

Selective Write Operation:

As shown in FIG. 35, a voltage of 0 V is applied to the read-inhibiting gate CG0. Voltage relationships for gates other than the read-inhibiting gate CG0 are the same as those in the conventional selective write operation, as shown in FIG. 35.

Normal Read Operation:

As shown in FIG. 35, a voltage of 0 V is applied to the read-inhibiting gate CG0 to turn off the transistor T0 having the read-inhibiting gate CG0 as its gate. Voltage relationships for gates other than the read-inhibiting gate CG0 are the same as those in the conventional read operation, as shown in FIG. 35, and data can be normally read out.

Read-inhibiting Operation:

As shown in FIG. 35, a voltage of 3 v is applied to the read-inhibiting gate CG0 to turn on the transistor T0 having the read-inhibiting gate CG0 as its gate. With this operation, data cannot be normally read out even when voltage relationships for gates other than the read-inhibiting gate CG0 are the same as those in the normal read operation, as shown in FIG. 35.

(Nineteenth Embodiment)

Figure 36:
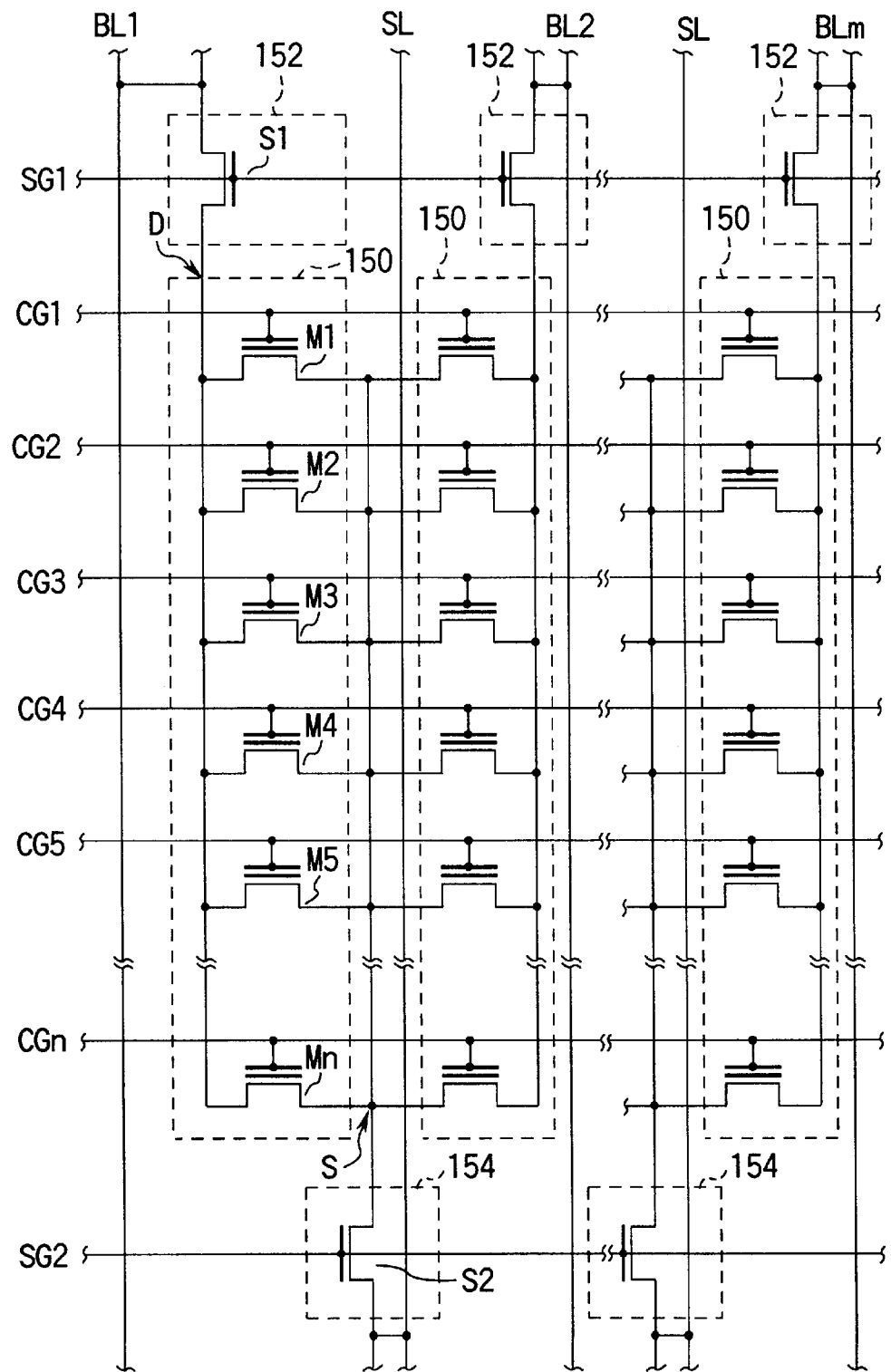
FIG. 36 is an equivalent circuit diagram of an HI-C cell type EEPROM according to a nineteenth embodiment of the present invention.

FIG. 36 is an equivalent circuit diagram of a memory cell array 2 of a Hi-C type EEPROM according to the nineteenth embodiment of the present invention.

In the Hi-C type EEPROM shown in FIG. 36, two NOR-type cells 150 share a source-side selection gate 154. More specifically, a memory cell 5 is formed of a drain-side selection gate 152, the NOR-type cell 150, and the source-side selection gate 154.

The read-inhibiting operation of the Hi-C type EEPROM shown in FIG. 36 can be realized on the basis of the same process as in the fourteenth or fifteenth embodiment.

(Twentieth Embodiment)

Figure 37:
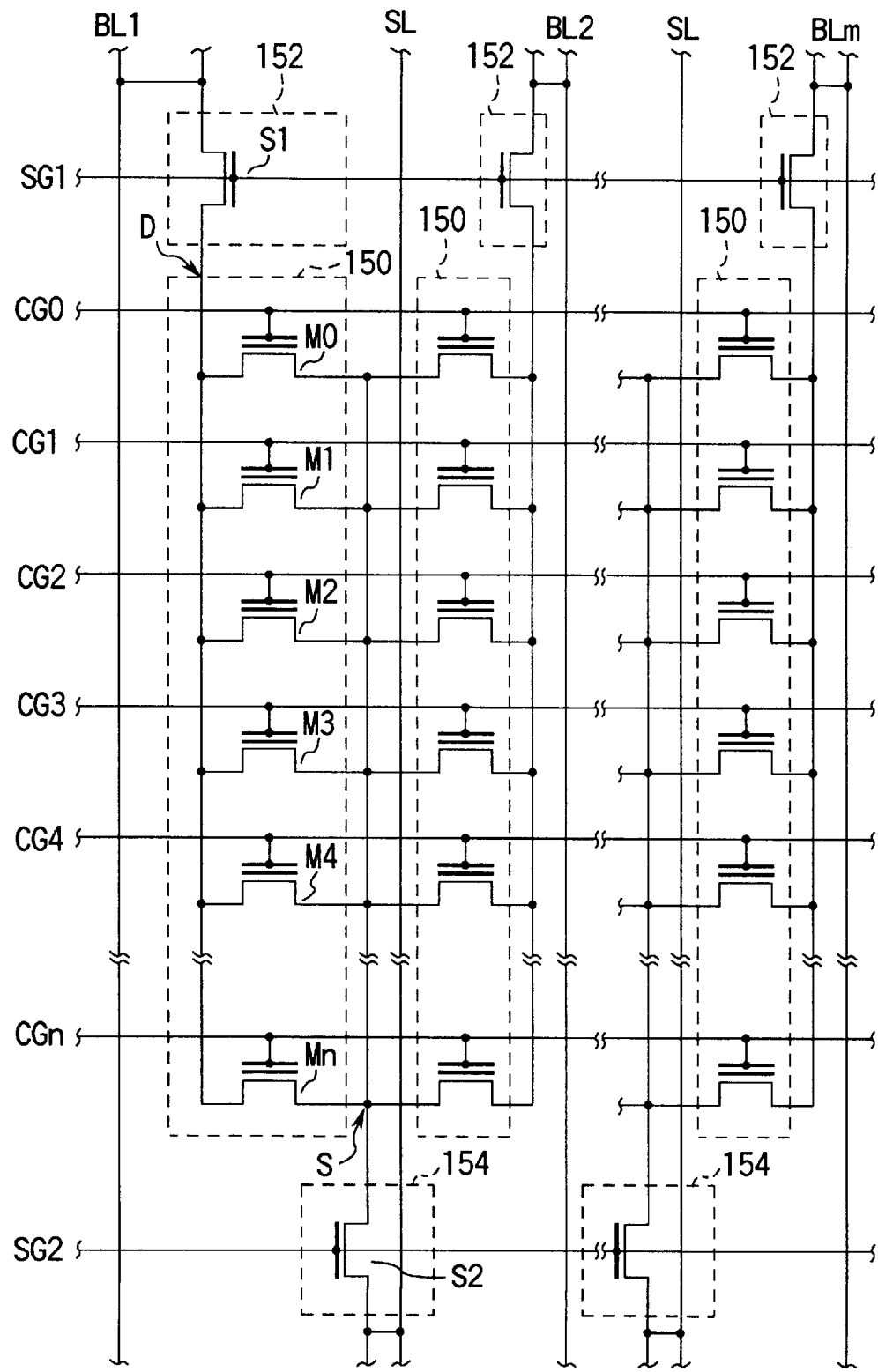
FIG. 37 is an equivalent circuit diagram of an HI-C cell type EEPROM according to a twentieth embodiment of the present invention.

FIG. 37 is an equivalent circuit diagram of a memory cell array 2 of a Hi-C type EEPROM according to the twentieth embodiment of the present invention.

The Hi-C type EEPROM shown in FIG. 37 is formed by adding a read-inhibiting gate CG0 to the Hi-C type EEPROM shown in FIG. 36. A memory transistor M0 is connected to the read-inhibiting gate CG0.

The read-inhibiting operation of the Hi-C type EEPROM shown in FIG. 37 can be realized on the basis of the same process as in the sixteenth or seventeenth embodiment.

(Twenty-first Embodiment)

Figure 38:
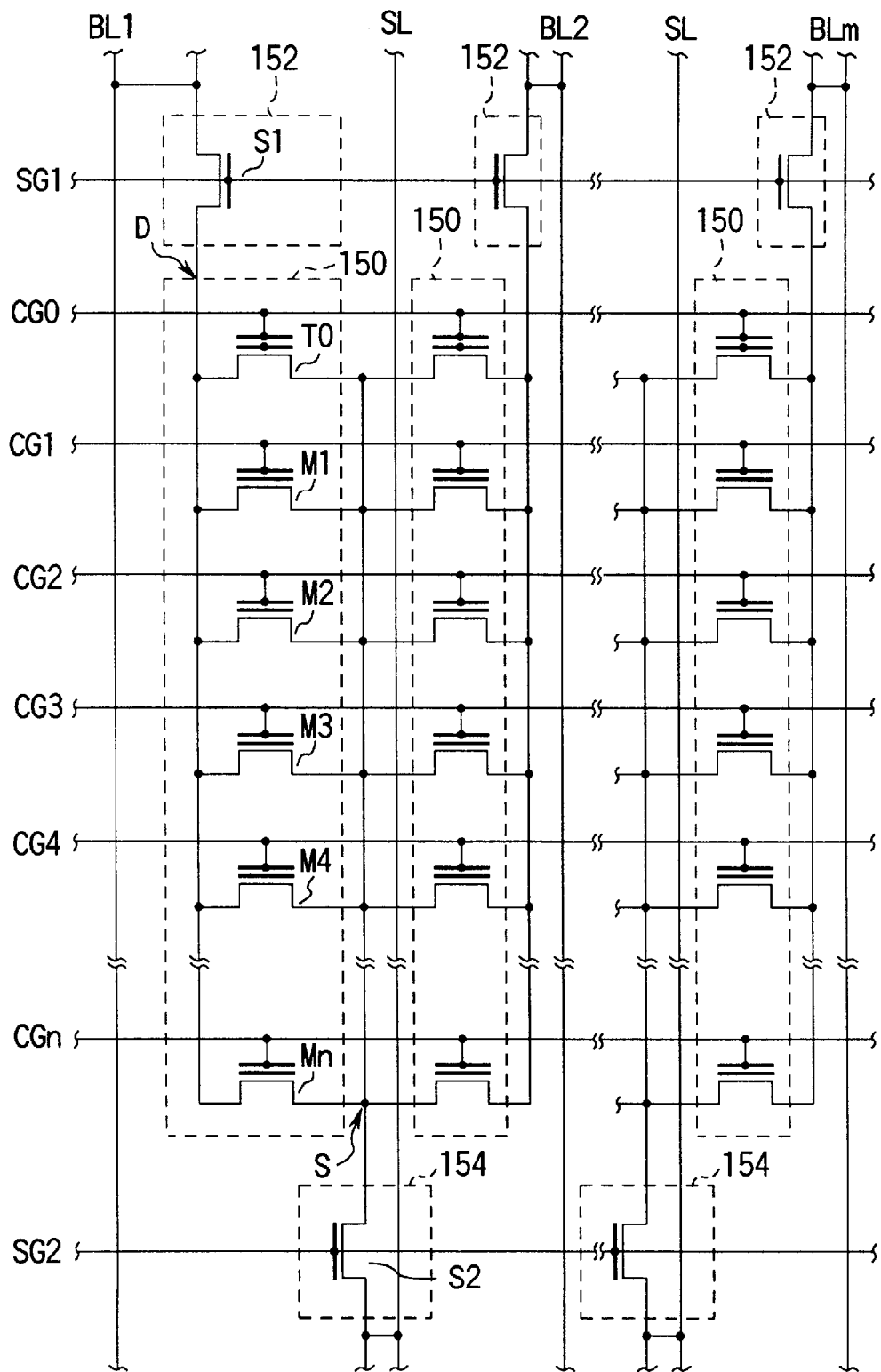
FIG. 38 is an equivalent circuit diagram of an HI-C cell type EEPROM according to a twenty-first embodiment of the present invention.

FIG. 38 is an equivalent circuit diagram of a memory cell array 2 of a Hi-C type EEPROM according to the twenty-first embodiment of the present invention.

In the twentieth embodiment shown in FIG. 37, the memory transistor M0 is connected to the read-inhibiting gate CG0. In the Hi-C type EEPROM shown in FIG. 38, a transistor T0 is connected to a read-inhibiting gate CG0.

The read-inhibiting operation of the Hi-C type EEPROM shown in FIG. 38 can be realized on the basis of the same process as in the eighteenth embodiment.

(Twenty-second Embodiment)

Figure 39:
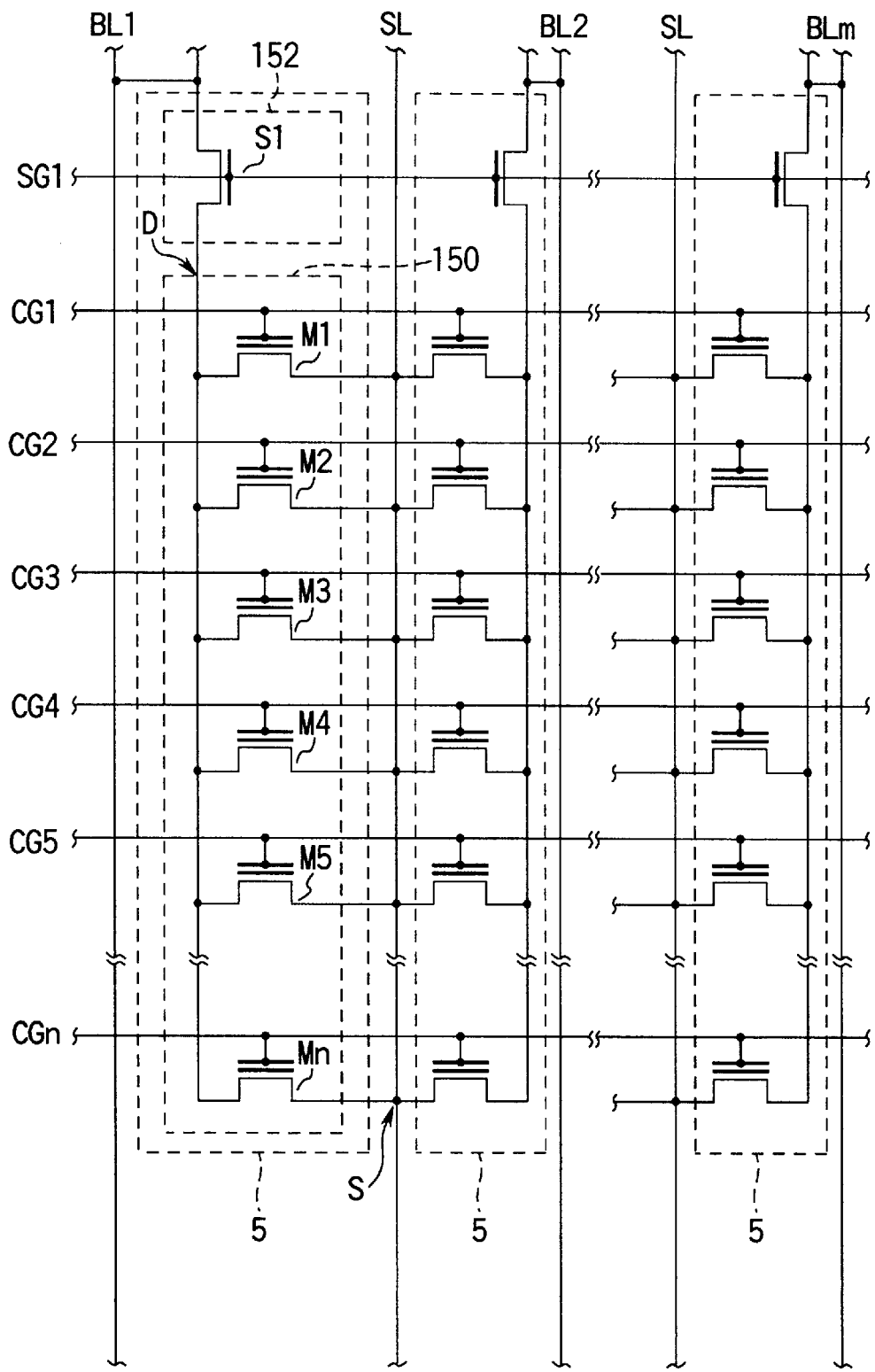
FIG. 39 is an equivalent circuit diagram of a DINOR-type EEPROM according to a twenty-second embodiment of the present invention.

FIG. 39 is an equivalent circuit diagram of a memory cell array 2 of a DINOR-type EEPROM according to the twenty-second embodiment of the present invention.

The DINOR-type EEPROM shown in FIG. 39 includes a NOR-type cell 150 formed of a plurality of memory transistors M1 to Mn which are connected in parallel, like an AND-type EEPROM. A drain terminal D of the NOR-type cell 150 is connected to a bit line BL1 through a selection transistor S1. The source of each of the memory transistors M1 to Mn is connected to a source line SL.

The read-inhibiting operation of the DINOR-type EEPROM shown in FIG. 39 can be realized on the basis of the same process as in the fourteenth or fifteenth embodiment.

(Twenty-third Embodiment)

Figure 40:
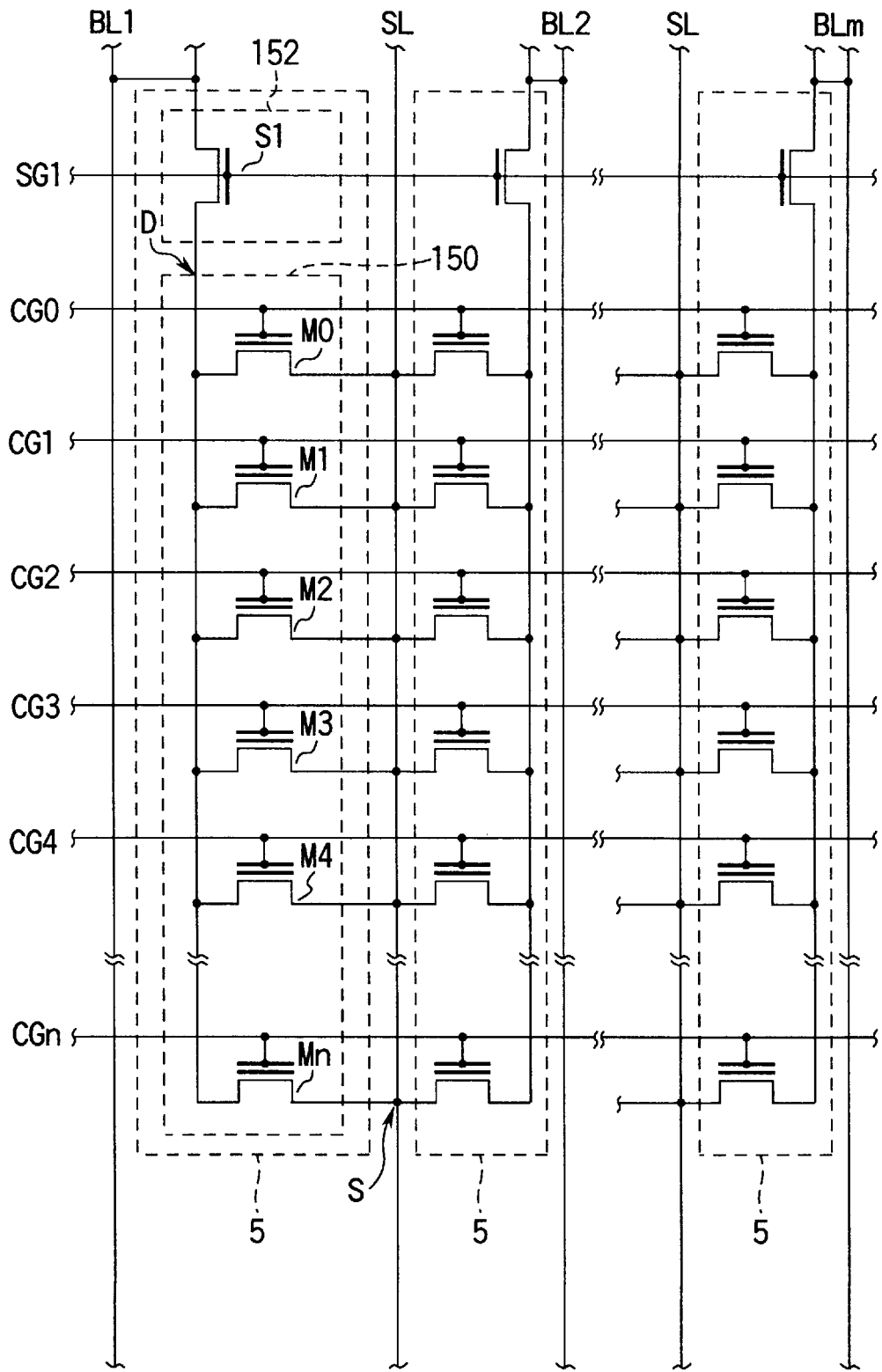
FIG. 40 is an equivalent circuit diagram of a DINOR-type EEPROM according to a twenty-third embodiment of the present invention.

FIG. 40 is an equivalent circuit diagram of a memory cell array 2 of a DINOR-type EEPROM according to the twenty-third embodiment of the present invention.

The DINOR-type EEPROM shown in FIG. 40 is formed by adding a read-inhibiting gate CG0 to the DINOR-type EEPROM shown in FIG. 39. A memory transistor M0 is connected to the read-inhibiting gate CG0.

The read-inhibiting operation of the DINOR-type EEPROM shown in FIG. 40 can be realized on the basis of the same process as in the sixteenth or seventeenth embodiment.

(Twenty-fourth Embodiment)

Figure 41:
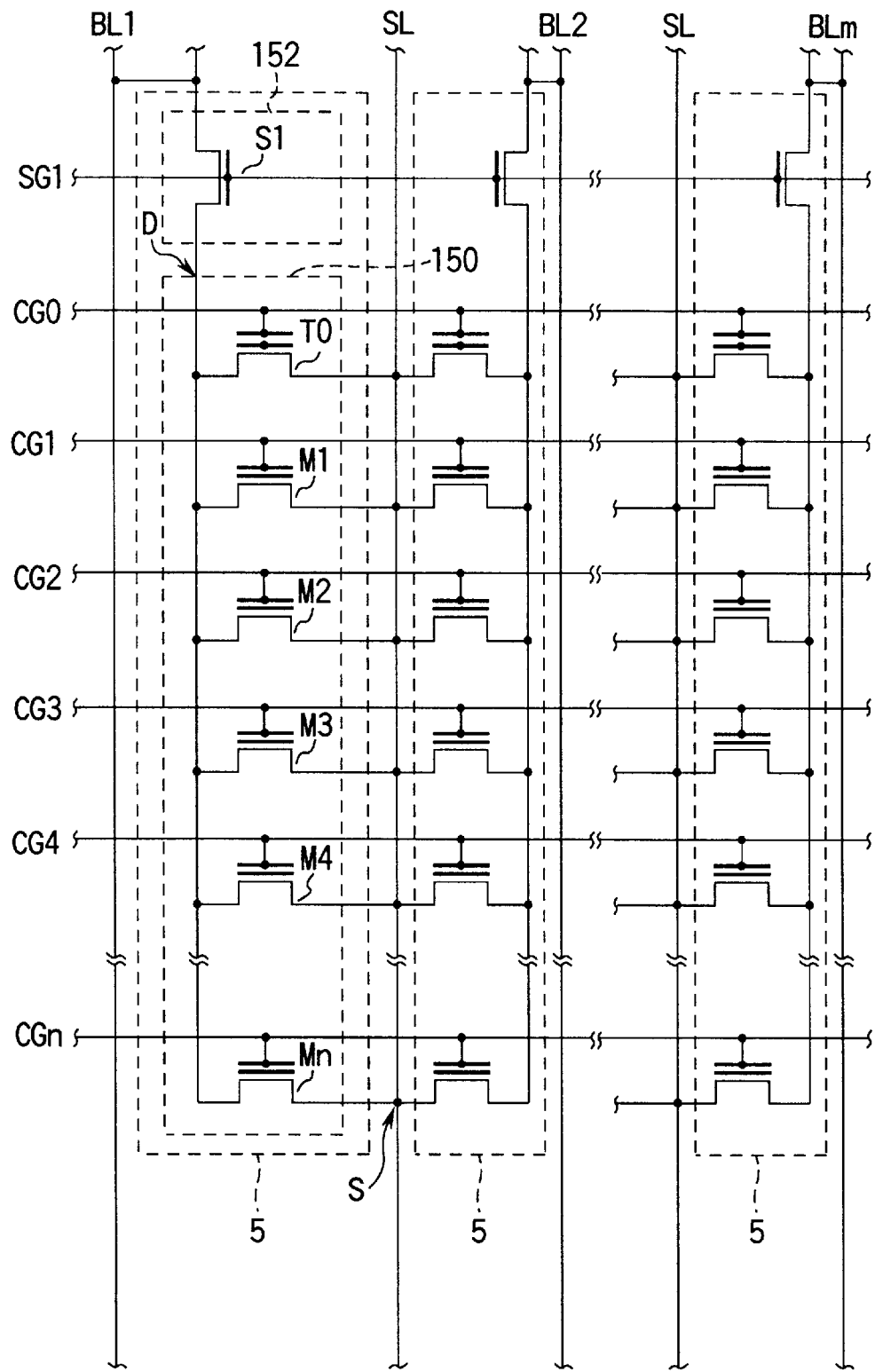
FIG. 41 is an equivalent circuit diagram of a DINOR-type EEPROM according to a twenty-fourth embodiment of the present invention.

FIG. 41 is an equivalent circuit diagram of a memory cell array 2 of a DINOR-type EEPROM according to the twenty-fourth embodiment of the present invention.

In the DINOR-type EEPROM shown in FIG. 41, a transistor T0 is connected to a read-inhibiting gate CG0.

The read-inhibiting operation of the DINOR-type EEPROM shown in FIG. 41 can be realized on the basis of the same process as in the twenty-third embodiment.

As has been described above, according to the present invention, a semiconductor integrated circuit capable of performing an operation of protecting stored data, a data read-inhibiting method for the semiconductor integrated circuit, and an integrated circuit type storage medium system using the semiconductor integrated circuit are provided.

The present invention is not limited to the first to twenty-fourth embodiments and can be applied to various EEPROMs or EPROMs. The present invention can be applied to a ground array type EEPROM or a FACE type EEPROM having a diffusion layer bit line. The memory transistor is not limited to a floating gate type, and an NMOS type transistor can also be used.

Though the above embodiments using n-type MOS transistors, the present invention can be exemplified by p-type MOS transistors. In this case, the voltage relationship is inverted. For example, the read-inhibiting voltage is higher than a highest threshold voltage of the memory elements in the first embodiment.

The present invention can be applied not only to an EEPROM or EPROM but also to a so-called mask ROM using, as a memory cell, a MOS transistor in which data is permanently written by channel ion implantation or the like.

In the first to twenty-fourth embodiments, a read-inhibiting state has been described. However, a write inhibiting state can be realized on the basis of the same process as in the read-inhibiting operation. When the write inhibiting state is realized, stored data can be protected from intentional destruction. Therefore, an operation of protecting stored data can be performed.

I claim:

1. A semiconductor memory device comprising:
   a first signal line and a second signal line;
   memory elements connected in series between said first signal line and said second signal line, each memory element having a variable threshold voltage;

a mode controller which sets either a read inhibit mode or a normal read mode; and a read-inhibiting circuit for applying a voltage for turning off at least one memory element in reading data from said memory elements if said mode controller sets the read inhibit mode.

2. The device according to claim 1, in which said read-inhibiting circuit applies a voltage lower than a lowest threshold voltage of said memory elements to a gate of said at least one memory element if said mode controller sets the read inhibit mode.

3. The device according to claim 1, in which said read-inhibiting circuit applies a read reference voltage to a gate of said at least one memory element when a threshold voltage of said at least one memory element is higher than said read reference voltage if said mode controller sets the read inhibit mode.

4. The device according to claim 3, in which the read reference voltage is 0 V.

5. The device according to claim 3, in which said at least one memory element stores data for indicating whether the read inhibit mode or the normal read mode is set.

6. A semiconductor memory device comprising:

a first signal line and a second signal line;

memory elements connected in parallel between said first signal line and said second signal line, each memory element having a variable threshold voltage;

a mode controller which sets either a read inhibit mode or a normal read mode; and a read-inhibiting circuit for applying a voltage for turning on at least one memory element in reading data from said memory elements if said mode controller sets the read inhibit mode.

7. The device according to claim 6, in which said read-inhibiting circuit applies a voltage higher than a highest threshold voltage of said memory elements to a gate of said at least one memory element if said mode controller sets the read inhibit mode.

8. The device according to claim 6, in which said read-inhibiting circuit applies a read reference voltage to a gate of said at least one memory element when a threshold voltage of said at least one memory element is lower than said read reference voltage if said mode controller sets the read inhibit mode.

9. The device according to claim 8, in which the read reference voltage is a power supply voltage.

10. The device according to claim 6, in which said at least one memory element stores data for indicating whether the read inhibit mode or the normal read mode is set.

11. A semiconductor memory device comprising:

a first signal line and a second signal line;

unit cells connected in parallel between said first signal line and said second signal line, each unit cell being formed of at least one memory element having a variable threshold voltage;

a selection element serially connected to at least one of a path between said unit cell and said first signal line and a path between said unit cell and a second signal line;

a mode controller which sets either a read inhibit mode or a normal read mode; and a read-inhibiting circuit for applying a voltage for turning off said selection element in reading data from said unit cells if said mode controller sets the read inhibit mode.

12. The device according to claim 11, in which said read-inhibiting circuit applies a voltage lower than a threshold voltage of said selection element to a gate of said selection element if said mode controller sets the read inhibit mode.

13. The device according to claim 11, in which said read-inhibiting circuit applies a voltage of 0 V to a gate of said selection element when a threshold voltage of said at least one memory element is higher than 0 V if said mode controller sets the read inhibit mode.

14. The device according to claim 11, in which said unit cell comprises a NAND-type unit cell including memory elements whose current paths are connected in series between said first signal line and said second signal line.

15. The device according to claim 11, in which said unit cell comprises NOR-type unit cell including memory elements whose current paths are connected in parallel between said first signal line and said second signal line.

16. A semiconductor memory device comprising:

a first signal line and a second signal line;

unit cells connected in parallel between said first signal line and said second signal line, each unit cell being formed of at least one memory element having a variable threshold voltage;

a selection element serially connected to said memory element in said unit cell between said first signal line and said second signal line;

a mode controller which sets either a read inhibit mode or a normal read mode; and a read-inhibiting circuit for applying a voltage for turning off said selection element in reading data from said unit cells if said mode controller sets the read inhibit mode.

17. The device according to claim 16, in which said unit cell comprises a NAND-type unit cell including memory elements whose current paths are connected in series between said first signal line and said second signal line.

18. The device according to claim 16, in which said selection element stores data for indicating whether the read inhibit mode or the normal read mode is set.

19. A semiconductor memory device comprising:

a first signal line and a second signal line;

unit cells connected in parallel between said first signal line and said second signal line, each unit cell being formed of at least one memory element having a variable threshold voltage;

a selection element connected in parallel to said unit cell between said first signal line and said second signal line;

a mode controller which sets either a read inhibit mode or a normal read mode; and a read-inhibiting circuit for applying a voltage for turning on said selection element in reading data from said unit cells if said mode controller sets the read inhibit mode.

20. The device according to claim 19, in which said unit cell comprises a NOR-type unit cell including memory elements whose current paths are connected in parallel between said first signal line and said second signal line.

21. The device according to claim 19, in which said selection element stores data for indicating whether the read inhibit mode or the normal read mode is set.

22. A data read-inhibiting method for a semiconductor integrated circuit, comprising the steps of:

registering data read inhibition;

requesting a unit cell array to read out data;

determining whether read inhibition is registered;

if read inhibition is not registered applying read enable voltages to the semiconductor integrated circuit for reading data from the read-requested address of said unit cell array; and if read inhibition is registered, at least applying read-inhibiting voltages to the semiconductor integrated circuit for inhibiting data reading from the read-requested address, the read-inhibiting voltages having at least one voltage which is different from that of the read enable voltages or outputting data representing read inhibition.

23. A data read-inhibiting method for a semiconductor integrated memory card which is adapted to be connected to an adapter, comprising the steps of:

registering chip data indicating a predetermined type of adapter in a semiconductor integrated circuit chip including a unit cell array;

inputting comparison data indicating a type of the adapter which is connected to the memory card to said semiconductor integrated circuit chip and comparing the input comparison data with the chip data;

requesting said unit cell array of said semiconductor integrated circuit chip to read out data;

if the comparison data does not match the chip data, setting a read-inhibiting mode in which read-inhibiting voltages are applied to the semiconductor integrated circuit or data representing read inhibition is output, the read-inhibiting voltages having at least one voltage which is different from that of read enable voltages for reading data from said memory card; and if the comparison data matches the chip data, resetting the read-inhibiting mode.

24. The method according to claim 22, in which:

said registering step comprises a substep of registering data read inhibition for an arbitrary address of the unit cell array;

said requesting step comprises a substep of requesting the arbitrary address of said unit cell array to read out data;

said determining comprises a substep of determining whether read inhibition is registered for the read-requested address;

said read enable voltages applying step comprises a substep of applying the read enable voltages to the semiconductor integrated circuit for reading data from the read-requested address of said unit cell array if read inhibition is not registered for the read-requested address; and said at least read-inhibiting voltages applying or representing read inhibition data outputting step comprises a substep of applying the read inhibiting voltages to the semiconductor integrated circuit for inhibiting data reading from the read-requested address if read inhibition is registered for the read-requested address.

25. A computer readable medium storing a computer program which, when executed, carries out the following steps with respect to a semiconductor integrated circuit:

registering data read inhibition;

requesting a unit cell array to read out data;

determining whether read inhibition is registered;

if read inhibition is not registered, applying read enable voltages to a semiconductor integrated circuit for reading data from a read-requested address of said unit cell array; and if read inhibition is registered, at least applying read-inhibiting voltages to the semiconductor integrated circuit for inhibiting data reading from the read-requested address, the read-inhibiting voltages having at least one voltage which is different from that of the read enable voltages or outputting data representing read inhibition.

26. A computer readable medium storing a computer program which, when executed, carries out the following steps with respect to a semiconductor integrated memory card which is adapted to be connected to an adapter:

registering chip data indicating a predetermined type of adapter in a semiconductor integrated circuit chip including a unit cell array;

inputting comparison data indicating a type of the adapter which is connected to the memory card to said semiconductor integrated circuit chip and comparing the input comparison data with the chip data;

requesting said unit cell array of said semiconductor integrated circuit chip to read out data;

if the comparison data does not match the chip data, setting a read-inhibiting mode in which read-inhibiting voltages are applied to the semiconductor integrated circuit or data representing read inhibition is output, the read-inhibiting voltages having at least one voltage which is different from that of read enable voltages for reading data from said memory card; and if the comparison data matches the chip data, resetting the read-inhibiting mode.

27. A semiconductor memory device comprising:

a first signal line and a second signal line memory elements connected in series between said first signal line and said second signal line, each memory element having a variable threshold voltage;

a mode controller which sets either a write inhibit mode or a normal write mode; and a write-inhibiting circuit for applying a voltage for turning off at least one memory element in writing data from said memory elements if said mode controller sets the write inhibit mode.

28. The device according to claim 27, in which said write-inhibiting circuit applies a voltage lower than a lowest threshold voltage of said memory elements to a gate of said given memory element if said mode controller sets the write inhibit mode.

29. The device according to claim 27, in which said write-inhibiting circuit applies a write reference voltage to a gate of said at least one memory element when a threshold voltage of said at least one memory element is higher than said write reference voltage if said mode controller sets the write inhibit mode.

30. The device according to claim 29, in which the write reference voltage is 0 V.

31. The device according to claim 29, in which said at least one memory element stores data for indicating whether the write inhibit mode or the normal write mode is set.

* * * * *

UNITED STATES PATENT AND TRADEMARK OFFICE
CERTIFICATE OF CORRECTION

PATENT NO.: 6,061,280
DATED: May 9, 2000
INVENTOR: Seiichi ARITOME

It is certified that an error appears in the above-identified patent and that said Letters Patent is hereby corrected as shown below:

In Claim 28, column 28, line 44, the word "given" has been deleted, and the phrase --at least one-- has been inserted.

Signed and Sealed this

Third Day of April, 2001

*Attest:*

NICHOLAS P. GODICI

*Attesting Officer*     *Acting Director of the United States Patent and Trademark Office*